(12) United States Patent
Oonakado et al.

(10) Patent No.: US 6,172,397 B1
(45) Date of Patent: *Jan. 9, 2001

(54) NON-VOLATILE SEMICONDUCTOR MEMORY DEVICE

(75) Inventors: Takahiro Oonakado; Hiroshi Onoda; Natsuo Ajika; Kiyohiko Sakakibara, all of Hyogo (JP)

(73) Assignee: Mitsubishi Denki Kabushiki Kaisha, Tokyo (JP)

( * ) Notice: Under 35 U.S.C. 154(b), the term of this patent shall be extended for 0 days.

This patent is subject to a terminal disclaimer.

(21) Appl. No.: 09/222,794

(22) Filed: Dec. 30, 1998

Related U.S. Application Data

(63) Continuation of application No. 08/596,820, filed on Feb. 5, 1996, now Pat. No. 5,877,524.

(30) Foreign Application Priority Data

Jun. 15, 1995 (JP) .................................................. 7-148969

(51) Int. Cl.[7] .................................................. H01L 29/788
(52) U.S. Cl. .................... 257/321; 257/315; 257/322; 365/185.01; 365/185.26
(58) Field of Search ..................................... 257/321, 315, 257/322; 365/185.18, 185.26, 185.28

(56) References Cited

U.S. PATENT DOCUMENTS

| | | | |
|---|---|---|---|
| 3,797,000 | 3/1974 | Agusta et al. | 365/185.29 |
| 3,868,187 | 2/1975 | Masuoka | 257/322 |
| 3,952,325 | 4/1976 | Beale et al. | 257/322 |

(List continued on next page.)

FOREIGN PATENT DOCUMENTS

| | | |
|---|---|---|
| 0730310 A1 | 9/1996 | (EP) . |
| 52-032234 | 11/1977 | (JP) . |
| 3-55881 | 3/1991 | (JP) . |
| 4-94578 | 3/1992 | (JP) . |
| 6-132541 | 5/1994 | (JP) . |
| 06291332 | 10/1994 | (JP) . |
| 94/022171 | 9/1994 | (WO) . |

OTHER PUBLICATIONS

Y.S. Hisamune, et al., A High Capacitive–Coupling Ratio (HiCR) Cell for 3 V–Only 64Mbit and Future Flash Memories, IEDM 1993, pp. 19–22.

Chih–Tang Sah, "Fundamentals of Solid–State Electronics", Scientific Publishing Co., Singapore, 1991, Chapter 6, pp. 640–641.

J. Chen et al., "Subbreakdown Drain Leakage Current in MOSFET", IEEE Electron Device Letters, vol. EDL–8, No. 11, Nov. 1987, pp. 515–518.

C.Y. Hu et al., "Substrate–Current–Induced Hot Electron (SCIHE) Injection: A New Convergence Scheme for Flash Memory", IEDM 1995, pp. 283–286.

J.D. Bude et al., "EEPROM/Flash Sub 3.0V Drain–Source Bias Hot Carrier Writing", IEDM 1995, pp. 989–991.

(List continued on next page.)

*Primary Examiner*—Olik Chaudhuri
*Assistant Examiner*—Phat X. Cao
(74) *Attorney, Agent, or Firm*—McDermott, Will & Emery

(57) ABSTRACT

In a non-volatile semiconductor memory device according to the present invention, a p type source region and a p type drain region are formed in the surface of an n well. A floating gate electrode and a control gate electrode are formed on a channel region with a tunnel oxide film interposed therebetween. According to this structure, a negative potential is applied to the drain region and a positive potential is applied to the control gate electrode when data is programmed, whereby electrons are injected from the drain region to the floating gate electrode by a band-to-band tunnel current induced hot electron injection current in the drain region. As a result, a non-volatile semiconductor memory device is provided which can prevent deterioration of the tunnel oxide film and which can be miniaturized.

33 Claims, 25 Drawing Sheets

U.S. PATENT DOCUMENTS

| | | | |
|---|---|---|---|
| 4,115,914 | 9/1978 | Harari | 438/157 |
| 4,399,523 | 8/1983 | Gerber et al. | 257/321 |
| 4,742,491 | 5/1988 | Liang et al. | 257/322 |
| 4,884,239 | 11/1989 | Ono et al. | 365/185.27 |
| 5,053,841 | 10/1991 | Miyakawa et al. | 257/321 |
| 5,321,287 | 6/1994 | Uemura et al. | 257/326 |
| 5,468,981 | 11/1995 | Hsu | 257/322 |
| 5,477,072 | 12/1995 | Goo | 257/322 |
| 5,559,735 | 9/1996 | Ono et al. | 257/315 |
| 5,572,464 * | 11/1996 | Iwasa | 365/185.17 |
| 5,574,685 | 11/1996 | Hsu | 257/321 |
| 5,596,528 | 1/1997 | Kaya et al. | 365/185.24 |
| 5,687,118 * | 11/1997 | Chang | 365/185.19 |
| 5,706,227 | 1/1998 | Chang et al. | 365/185.18 |
| 5,739,569 * | 4/1998 | Chen | 257/321 |
| 5,822,242 * | 10/1998 | Chen | 365/185.01 |
| 5,877,524 * | 3/1999 | Oonakado et al. | 257/321 |

OTHER PUBLICATIONS

Kobayashi et al., "Memory Array Architecture and Decoding Scheme for 3 V Only Sector Erasable DINOR Flash Memory", IEEE Journal of Solid–State Circuits, vol. 29, No. 4, Apr. 1994, pp. 454–460.

Onoda et al., "Improved Array Architectures of DINOR for 0.5$\mu$m 32M and 64Mbit Flash Memories", IEICE Trans. Electron., vol. E77–C, No. 8, Aug. 1994, pp. 1279–1286.

Ajika et al., "A 5 Volt Only 16M Bit Flash EEPOM Cell With a Simple Stacked Gate Structure", IEDM Technical Digest, 1990, pp. 115–118.

Wann et al., "Suppressing Flash EEPROM Erase Leakage with Negative Gate Bias and LDD Erase Junction", Symp. VLSI Tech., 1993, pp. 81–82.

Schuegraf et al., "Oxide Breakdown Model for Very Low Voltages", Symp. VLSI Tech., 1993, pp. 43–44.

"Analysis of Excess Current Induced by Hot–Hole Injection into thin $SiO_2$ Films", Proceedings of $42^{nd}$ Lecture Meeting Related to Applied Physics, pp. 656.

San et al., "Effects of Erase Source Bias on Flash EPROM Device Reliability", IEEE Transactions on Electrons on Electron Devices, vol. 42, No. 1, Jan. 1995, pp. 150.

Haddad et al., "An Investigation of Erase–Mode Dependent Hole Trappings in Flash EEPROM Memory Cell", IEEE Electron Devices, vol. 11, Nov. 1990, pp. 514.

"Flash Memory Technology Handbook", Science Forum Press, 1993, pp. 56.

Feng et al., "MOSFET Drain Breakdown Voltage", IEEE Electron Device Letters, vol. EDL–7, No. 7, Jul. 1986, pp. 449.

Parke et al., "Design for Suppression of Gate–Induced Drain Leakage in LDD MOSFET's Using a Quasi–Two–Dimensional Analytical Model", vol. 39, No. 7, Jul. 1992, pp. 1694.

Hsu et al., "A High Speed, Low Power P–Channel Flash EEPROM Using Silicon Rich Oxide as Tunneling Dielectric", Extended Abstracts of the 1992 Int. Conf. on Solid State Devices and Materials, 1992, pp. 140–142.

"A Novel Band–to–Band Tunneling Induced Convergence Mechanism for Low Current, High Density Falsh EEPROM Applications", IEDM Technical Digest, 1994, pp. 41–44.

* cited by examiner

⟨PROGRAMMING⟩

⟨ERASING⟩

| | DRAIN | CONTROL GATE | SOURCE | P WELL |
|---|---|---|---|---|
| PROGRAMMING | NEGATIVE VOLTAGE (-3~-10V) | POSITIVE VOLTAGE (4~11V) | OPEN | GROUND |
| ERASING | OPEN | NEGATIVE VOLTAGE (-5~-12V) | POSITIVE VOLTAGE (5~12V) | POSITIVE VOLTAGE (5~12V) |
| READING | NEGATIVE VOLTAGE (-0.1~-2V) | NEGATIVE VOLTAGE (-1.5~-5V) | GROUND | GROUND |

VOLTAGE APPLICATION CONDITION OF
THE PRESENT INVENTION(PMOS TYPE)

PROGRAMMING CHARACTERISTICS
OF THE PRESENT INVENTION

ERASING CHARACTERISTICS
OF THE PRESENT INVENTION

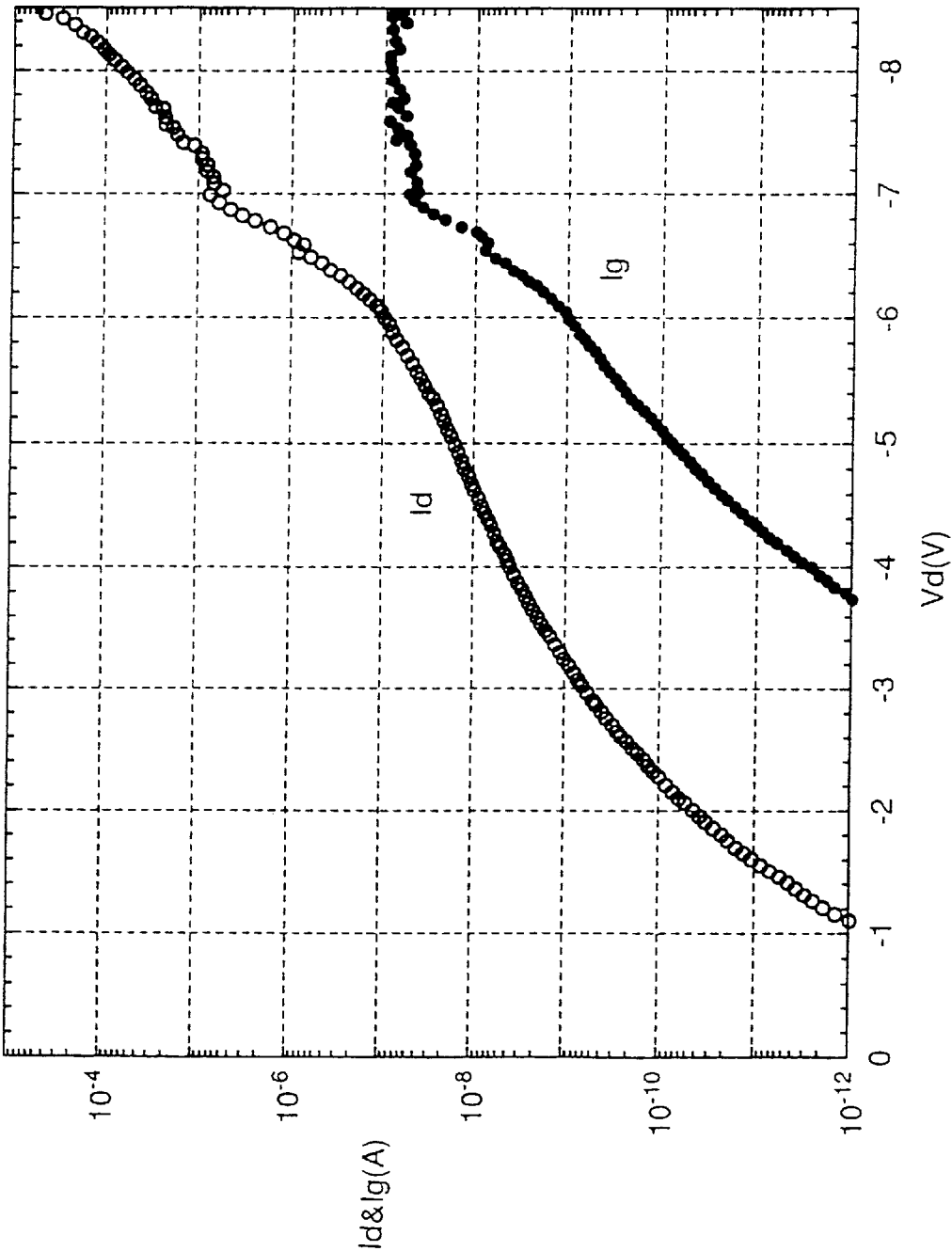

FIG.27

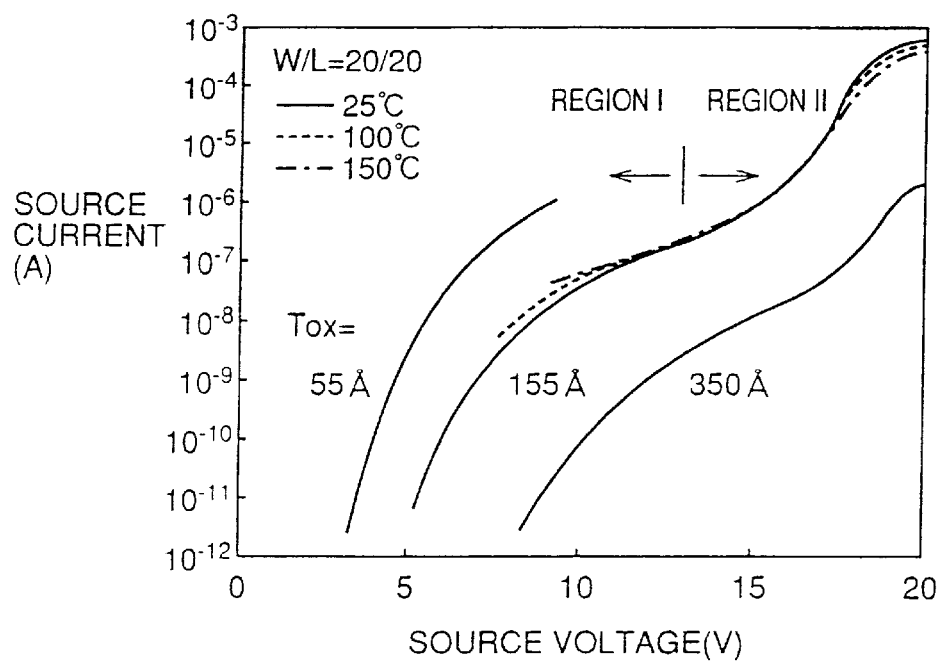

FIG.28

|  | REGION I | REGION II |
|---|---|---|
| (FIRST) GATE FILM THICKNESS | NEGATIVE DEPENDENCY | NEGATIVE DEPENDENCY |
| TEMPERATURE DEPENDENCY | WEAK POSITIVE DEPENDENCY | WEAK NEGATIVE DEPENDENCY |
| SUBSTRATE POTENTIAL DEPENDENCY | HARDLY DEPENDENT | NEGATIVE DEPENDENCY |
| SUBSTRATE CONCENTRATION DEPENDENCY | HARDLY DEPENDENT | POSITIVE DEPENDENCY |
| CHANNEL LENGTH DEPENDENCY | HARDLY DEPENDENT | HARDLY DEPENDENT |

MECHANISM OF GENERATION OF ELECTRON-HOLE
PAIR BY BAND-TO-BAND TUNNELING

⟨PROGRAMMING⟩

⟨ERASING⟩

FIG.36 PRIOR ART

|  | DRAIN | CONTROL GATE | SOURCE | P WELL |
|---|---|---|---|---|
| PROGRAMMING | POSITIVE VOLTAGE (4~8V) | NEGATIVE VOLTAGE (-8~-11V) | OPEN | GROUND |
| ERASING | OPEN | POSITIVE VOLTAGE (8~12V) | NEGATIVE VOLTAGE (-6~-11V) | NEGATIVE VOLTAGE (-6~-11V) |
| READING | POSITIVE VOLTAGE (1~2V) | POSITIVE VOLTAGE (3~5V) | GROUND | GROUND |

RESPECTIVE VOLTAGE APPLICATION CONDITIONS
OF OPERATION OF CONVENTIONAL TYPE DINOR

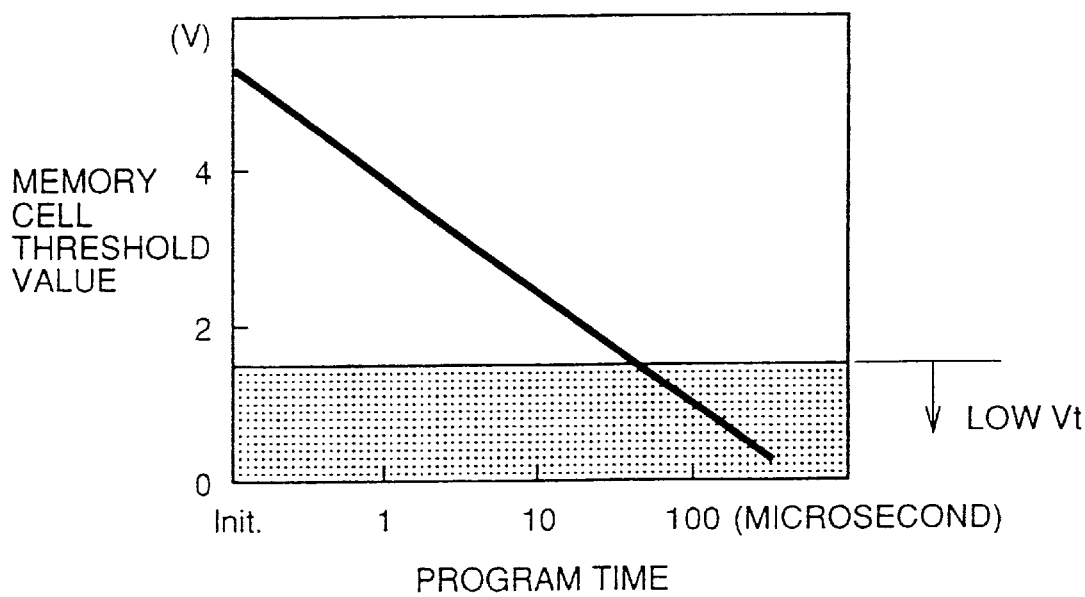

FIG.37 PRIOR ART

PROGRAMMING CHARACTERISTICS
OF CONVENTIONAL DINOR

ERASING CHARACTERISTICS
OF CONVENTIONAL TYPE DINOR

NMOS BAND-TO-BAND
TUNNELING PHENOMENON

NON-VOLATILE SEMICONDUCTOR MEMORY DEVICE

This application is a continuation of application Ser. No. 08/596,820 filed Feb. 5, 1996, U.S. Pat. No. 5,877,524.

BACKGROUND OF THE INVENTION

1. Field of the Invention

The present invention generally relates to non-volatile semiconductor memory devices, and more particularly, to a non-volatile semiconductor memory device carrying out programming, erasing, and the like with a p channel type memory cell.

2. Description of the Background Art

A flash memory which is one kind of a non-volatile semiconductor memory device is the most promising memory device for the next generation because of its manufacturing cost lower than that of a dynamic random access memory (DRAM).

Memory cells constituting the flash memory each generally include an n type source region and an n type drain region formed in the surface of a p type region, a floating gate electrode (electric charge storage electrode) formed on a channel region sandwiched by the source region and the drain region with a tunnel oxide film interposed therebetween, and a control gate electrode (control electrode) formed on the floating gate electrode with an insulating film interposed therebetween.

In each memory cell, a source line is connected to the source region. A bit line is connected to the drain region. The floating gate electrode stores information. A word line is connected to the control gate electrode.

A programming operation and an erasing operation of an NOR type flash memory will now be described with reference to FIGS. 32 and 33. In the programming operation, a voltage of approximately 5 V is applied to a drain region 33, and a voltage of approximately 10 V is applied to a control gate 37, as shown in FIG. 32. A source region 32 and a p well 31 are kept at a ground potential (0 V).

At this time, there is a current flow of several hundreds $\mu A$ through the channel of the memory cell. An electron accelerated in the vicinity of drain region 33 among electrons moving from source region 32 to drain region 33 is turned into an electron having high energy, that is, a so-called channel hot electron, in this vicinity. This electron is injected into a floating gate electrode 35, as indicated by arrow A in the figure, by an electric field generated by the voltage applied to control gate 37. Thus, electrons are stored in floating gate electrode 35, and a threshold voltage $V_{th}$ of the memory cell attains 8 V, for example. This state is referred to as a programmed state, "0".

Then, the erasing operation will be described with reference to FIG. 33. A voltage of approximately 5 V is applied to source region 32, a voltage of approximately −10 V is applied to control gate electrode 37, and p type well 31 is maintained at the ground potential. At this time, drain region 33 is brought to an open state. An electron in floating gate electrode 35 passes through thin tunnel oxide film 34 by an FN tunneling phenomenon caused by an electric field generated by the voltage applied to source region 32, as indicated by arrow B in the figure. Thus, the threshold voltage $V_{th}$ of the memory cell attains 2 V, for example, by ejection of electrons in floating gate electrode 35. This state is referred to as an erased state, "1".

Other than the above described NOR type flash memory which carries out programming by the channel hot electrons and erasing by the FN tunneling phenomenon, various kinds of flash memories have been developed which consume less current at the time of programming and erasing, because they operate based on a single power source. A DINOR (divided bit line NOR) flash memory described in "Memory Array Architecture and Decoding Scheme for 3 V Only Sector Erasable DINOR Flash Memory," IEEE Journal of Solid-State Circuits, (Vol. 29, No. 4, April 1994): 454–460, or "Improved Array Architectures of DINOR for 0.5 $\mu m$ 32 M and 64 M bit Flash Memories," IEICE Trans. Electron, (Vol. E77-C, No. 8, August 1994): 1279–1286 is one of them.

This DINOR type flash memory's structure and its operation principle will now be described with reference to FIGS. 34 to 36. Similar to the case of the above described memory cell of the NOR type flash memory, a memory cell of this DINOR type flash memory includes n type source region 32 and n type drain region 33 formed in the surface of p well 31. Floating gate electrode 35 is formed on the channel region sandwiched by source region 32 and drain region 33 with tunnel oxide film 34 interposed therebetween. Control gate electrode 37 is formed on floating gate electrode 35 with an insulating film 36 interposed therebetween.

The above structured memory cell is generally referred to as a stacked gate type memory cell. Source regions 32 are electrically connected in common in all memory cells or in a block formed of a predetermined number of memory cells. A word line is connected to control gate electrode 37, and a bit line is connected to drain region 33. A predetermined word line and a predetermined bit line are selected in such a structure, so that a predetermined memory cell is selected.

The programming operation will first be described with reference to FIGS. 34 to 36. In the programming operation, a negative voltage of approximately −8 V to approximately −11 V is applied to control gate electrode 37, and a positive potential of approximately 4 V to approximately 8 V is applied to drain region 33. At this time, p well 31 is kept at the ground potential (0 V), and source region 32 remains open. During this state, a strong electric field is applied to tunnel oxide film 34 in a region where floating gate electrode 35 and drain region 33 overlap each other. This application of the strong electric field causes the FN tunneling phenomenon, and electrons are injected from floating gate electrode 35 to drain region 33 through tunnel oxide film 34. This programming operation brings the memory cell to "Low Vt" (low Vth state).

On the other hand, in the erasing operation, a positive potential of approximately 8 V to approximately 12 V is applied to control gate electrode 37, a negative potential of approximately −6 V to −11 V is applied to source region 32 and p well 31, and drain region 33 is maintained open. In this state, a channel layer of an electron 38 is formed in the channel portion of the memory cell and a strong electric field is applied to tunnel oxide film 34 between the channel layer and floating gate electrode 35. This strong electric field causes the FN tunneling phenomenon, and electron 38 of the channel layer is injected into floating gate electrode 35. This erasing operation brings the memory cell to "High Vt" (high Vth state).

In a reading operation, a positive potential of about 3 V to 5 V which is approximately intermediate between "Low Vt" and "High Vt" is applied to control gate electrode 37, source region 32 and p well 31 are grounded, and a positive potential of about 1 V to about 2 V is applied to drain region 33, so that it is confirmed whether or not there is a current flow through the memory cell. Based on this confirmation, it is determined whether the memory cell is in a state of "High Vt" or "Low Vt".

FIG. 37 is a diagram representing programming characteristics of the above described memory cell of the DINOR type flash memory, indicating that the threshold value becomes smaller in a positive range as a programming time becomes longer. FIG. 38 shows erasing characteristics of the above described memory cell of the DINOR type flash memory, indicating that the threshold value of the memory cell becomes larger in a positive range as an erasing time becomes longer.

The above described conventional DINOR type flash memory has the following problem.

In the programming operation of the DINOR type flash memory, such potential application conditions as shown in FIGS. 34 and 36 are used. More specifically, p well 31 is grounded, source region 32 is brought to an open state, and a positive potential and a negative potential are applied to drain region 33 and control gate electrode 37, respectively, whereby electron 38 is drawn to drain region 33 from floating gate electrode 35.

This ejection of electrons uses the same phenomenon as was used in the erasing operation of the DINOR type flash memory described in "A 5 Volt Only 16 M bit Flash EEPROM Cell with a Simple Stacked Gate Structure," IEDM Technical Digest (1990): 115–118 or explained with reference to FIG. 33. A method of ejecting electrons into an n type impurity diffusion layer is described in "Suppressing Flash EEPROM Erase Leakage with Negative Gate Bias and LDD Erase Junction," (Symp. VLSI Tech., 1993): 81–82, for example.

In the above described DINOR type flash memory, for example, a strong electric field is applied between floating gate electrode 35 and drain region 33, as shown in FIG. 39. Therefore, a band-to-band tunneling phenomenon occurs in p well 31 in the vicinity of drain region 33. As a result, an electron-hole pair 40 is produced in drain region 33, causing a drain leakage. This drain leakage is referred to GIDL (Gate Induced Drain Leakage).

Electron 38 of electron-hole pair 40 produced by the band-to-band tunneling phenomenon is drawn to drain region 33 supplied with a positive potential. On the other hand, a hole 39 is pulled in the channel direction, and flows towards p well 31. Since hole 39 is accelerated by a depletion layer electric field between drain region 33 and p well 31 to obtain high energy (which is called a hot hole), a part of holes 39 are injected into tunnel oxide film 34.

The influence of hole 39 on tunnel oxide film 34 has been widely studied from the standpoint of reliability of a gate oxide film in an MOSFET. It is generally confirmed that hole 39 does serious damage to tunnel oxide film 34.

According to a close study described in "Oxide Breakdown Model for Very Low Voltages," Symp. VLSI Tech. (1993): 43–44, for example, there is a close correlation between the lifetime of TDDB of a silicon oxide film used as a gate insulating film and a total amount of holes which pass through the film upon application of a voltage. From the standpoint of reliability of data retention characteristics of a flash memory, it is reported in recent years that a leakage current of a gate oxide film at a low voltage is increased by injection of hot holes into the gate oxide film. This is described in "Analysis of Excess Current Induced by Hot-Hole Injection into Thin $SiO_2$ Films," Proceedings of the 42nd Lecture Meetings Related to Applied Physics (No. 2, 28a-C-10): 656, for example.

As described above, the problem in the memory cell of the conventional DINOR type flash memory is that the potential application conditions under which GIDL is likely to be generated are employed during the programming operation. As a result, hot holes are injected into the tunnel oxide film at the time of programming, causing a marked deterioration of the tunnel oxide film (cf. K. Tamer San, et al. "Effect of Erase Source Bias On Flash EPROM Device Reliability," IEEE Transactions on Electron Devices (Vol. 42, No. 1, January 1995): 150.

In recent years, an electric field relaxation layer 41 having a gentle $n^-$ impurity distribution is formed so as to surround drain region 33, as shown in FIG. 40 for example, in order to suppress the above-described deterioration of the tunnel oxide film by injection of hot holes. Provision of electric field relaxation layer 41 allows relaxation of the lateral electric field in drain region 33 which draws electrons from floating gate electrode 35 by the FN tunneling phenomenon.

However, formation of electric field relaxation layer 41 has a disadvantage of a small effective gate length $L_1$, since an overlap length L between an impurity diffusion layer and floating gate electrode 35 becomes longer. Electric field relaxation layer 41 causes punch-through even in a memory cell having a longer effective gate length, when the memory cell is miniaturized.

Therefore, the memory cell of the conventional DINOR type flash memory cannot be miniaturized, hampering high integration of memory cells in a memory cell array.

SUMMARY OF THE INVENTION

One object of the present invention is to provide a non-volatile semiconductor memory device which can carry out erasing, programming, and reading with a p type MOS memory cell.

Another object of the present invention is to provide a non-volatile semiconductor memory device using a p type MOS memory cell in which this memory cell is miniaturized, and in which a punch-through phenomenon is less likely to occur.

Still another object of the present invention is to provide a flash memory such as an NOR type flash memory and a DINOR type flash memory using a p type MOS memory cell.

In order to achieve the above objects, in one aspect of the present invention, a non-volatile semiconductor memory device having a p type source region and a p type drain region formed in the surface of an n type region, an electric charge storage electrode formed on a channel region sandwiched by the source region and the drain region with a tunnel oxide film therebetween, and a control electrode formed on the electric charge storage electrode with an insulating film therebetween includes a negative potential applying device for applying a negative potential to the drain region in programming data, and a positive potential applying device for applying a positive potential to the electric charge storage electrode in programming data, wherein electrons are injected from the drain region to the electric charge storage electrode by band-to-band tunnel current induced hot electron injection in the drain region.

According to this structure, the band-to-band tunnel current is generated in the drain region to produce an -electron-hole pair. An electron of the pair is accelerated in the channel direction by a lateral electric field, and turned into a hot electron having high energy. Since a positive potential is applied to the control electrode at this time, the hot electron is easily injected into the tunnel oxide film to reach the electric charge storage electrode. Thus, the electrons are injected into the electric charge storage electrode by the band-to-band tunnel current induced hot electron injection.

In this structure, a hole of the electron-hole pair generated by the band-to-band tunnel current in the vicinity of the drain region at the time of programming is pulled towards the p type drain region, and the hole is scattered in the drain region due to a high hole concentration in the drain region and deprived of energy. Therefore, the hole is not turned into a hot hole having high energy. More specifically, generation of hot holes, which has been problematic in a conventional n channel type memory cell, can be prevented. Even if a hot hole is generated in the structure of the present invention, the hot hole is not injected into the electric charge storage electrode because the electric charge storage electrode is supplied with a positive potential. Therefore, injection of hot holes into the tunnel oxide film can be eliminated, and a marked deterioration of the tunnel oxide film by the hot hole injection, which is typical for the conventional n channel memory cell, can be prevented. Further, since hot holes are not injected into the tunnel oxide film, it is not necessary to form an electric field relaxation layer which hampers miniaturization of the conventional n channel type memory cell. Therefore, a memory cell can be more miniaturized than the case of the conventional n channel type memory cell.

In another aspect of the present invention, a non-volatile semiconductor memory device having a p type source region and a p type drain region formed in the surface of an n type region, an electric charge storage electrode formed on a channel region sandwiched by the source region and the drain region with a tunnel oxide film therebetween, and a control electrode formed on the electric charge storage electrode with an insulating film therebetween includes a negative potential applying device for applying a negative potential to the drain region in programming data, and a positive potential applying device for applying a positive potential to the electric charge storage electrode in programming data, wherein a strong electric field is applied to the tunnel oxide film in a region sandwiched by the electric charge storage electrode and the drain region to inject an electron from the drain region to the electric charge storage electrode by an FN tunneling phenomenon.

According to this structure, the strong electric field applied to the tunnel oxide film on an overlap region of the electric charge storage electrode and the drain region causes the FN tunneling phenomenon, whereby an electron can be injected from the drain region to the electric charge storage electrode through the tunnel oxide film.

As a result, a hole in an electron-hole pair generated by a band-to-band tunnel current is pulled towards the drain region in the vicinity of the drain region at the time of programming. The hole is scattered in the drain region due to a high hole concentration in the drain region and deprived of energy. Therefore, the hole is not turned into a hot hole. More specifically, generation of hot holes, which has been problematic in the conventional n channel type memory cell, can be prevented.

Even if there is a hot hole in the above structure, the hot hole is not injected into the electric charge storage electrode, because a positive potential is applied to the electric charge storage electrode. Therefore, the hot hole injection into the tunnel oxide film can be prevented, and a marked deterioration of the tunnel oxide film by the hot hole injection, which has been a serious problem in the conventional n channel type memory cell, can be prevented.

Since the hot hole is not injected, it is not necessary to form an electric field relaxation layer which hampers miniaturization of the conventional n channel type memory cell. As a result, a memory cell in the present invention can be more miniaturized than the case of the conventional n channel type memory cell, allowing higher integration.

In still another aspect of the present invention, a non-volatile semiconductor memory device having a p type source region and a p type drain region formed in the surface of an n type region, an electric charge storage electrode formed on a channel region sandwiched by the source region and the drain region with a tunnel oxide film therebetween, and a control electrode formed on the electric charge storage electrode with an insulating film therebetween includes a negative potential applying device for applying a negative potential to the control electrode in erasing data, and a positive potential applying device for applying a positive potential to the source region and the n type region in erasing data, wherein a channel layer of holes is formed in the channel region, a strong electric field is applied to the tunnel oxide film interposed between the channel layer of holes and the electric field storage electrode, and an electron is injected into the channel layer of holes from the electric charge storage electrode by an FN tunneling phenomenon.

According to this structure, the channel layer of holes is formed in the channel region, and the strong electric field is applied to the tunnel oxide film interposed between the channel layer of holes and the electric charge storage electrode. The FN tunneling phenomenon occurs in the tunnel oxide film, allowing injection of an electron from the electric charge storage electrode to the channel layer of holes.

As a result, holes can be drawn from the electric charge storage electrode using the entire surface of the channel layer, making it possible to carry out an erasing operation of a flash memory efficiently.

Preferably, the non-volatile semiconductor memory device further includes an open device for bringing the source region to an open state in programming data, and a ground device for bringing the n type region to a ground state in programming data.

As a result, at the time of programming of data, the non-volatile semiconductor memory device can be operated stably, whereby the reliability of the non-volatile semiconductor memory device at the time of programming of data can be improved.

Preferably, the channel region includes a p type buried layer.

Provision of the p type buried layer prevents reduction of the mobility of the hole by scattering at an interface between the n type region and the tunnel oxide film. As a result, reduction of the mobility of the hole can be avoided, making it possible to improve the driving ability of the non-volatile semiconductor memory device.

Preferably, the electric charge storage electrode is formed of n type polycrystalline silicon.

By forming the electric charge storage electrode of n type polycrystalline silicon, a surface lateral electric field in the drain region becomes greater, generation of the band-to-band tunnel current in the drain region is increased, and an acceleration electric field is increased. Therefore, an electron obtains higher energy in the drain region, making it possible to improve the programming efficiency.

As a result, the programming speed can be increased, and the programming breakdown voltage can be decreased. Further, the punch-through resistance is improved, whereby miniaturization of a memory cell, that is, high integration can be implemented.

Preferably, the electric charge storage electrode is formed of p type polycrystalline silicon.

The electric charge storage electrode formed of p type polycrystalline silicon increases the surface lateral electric field in the drain region, the amount of generation of the band-to-band tunnel current is increased, and the acceleration electric field in the drain region is increased. Therefore, an electron obtains higher energy, whereby the programming efficiency is improved. As a result, the programming speed can be increased, and the programming breakdown voltage can be decreased. Further, the punch-through resistance becomes high, allowing miniaturization of a memory cell, that is, high integration.

Preferably, the source region and the drain region are structured in symmetry to the electric charge storage electrode and the control electrode.

Such a symmetrical structure decreases the number of masks used in ion injection at the time of formation of the source region and the drain region. Decrease in the number of masks leads to reduction of the number of manufacturing steps, resulting in cost reduction.

Preferably, a region in the drain region positioned under the electric charge storage electrode has an impurity concentration of $5 \times 10^{19}$ cm$^{-3}$ or less.

As a result, in the non-volatile semiconductor memory device which carries out programming using the band-to-band tunnel induced hot electron injection current, a memory cell having a long effective gate length and allowing miniaturization, that is, high integration can be obtained.

Preferably, the region in the drain region positioned under the electric charge storage electrode has an impurity concentration of $5 \times 10^{19}$ cm$^{-3}$ or more, and a region of the source region positioned under the electric charge storage electrode has an impurity concentration of $5 \times 10^{19}$ cm$^{-3}$ or less.

By using this structure, the amount of generation of the band-to-band tunnel current can be increased in the drain region. As a result, the programming speed can be increased, and a drain voltage and a control electrode voltage at the time of programming can be decreased.

Preferably, the non-volatile semiconductor memory device further includes a first impurity region formed in contact with the source region and having a p type impurity concentration lower than the impurity concentration of the source region, and a second impurity region formed in contact with the drain region and having a p type impurity concentration lower than the impurity concentration of the drain region.

By this structure, a so-called LDD structure is implemented, and a memory cell having a long effective gate length and allowing miniaturization, that is, high integration can be obtained.

Preferably, the non-volatile semiconductor memory device includes a third n type impurity region formed in the n type region in contact with the drain region so as to surround the drain region.

By this structure, the lateral electric field in a drain depletion layer is increased, and the electron can be supplied with high energy efficiently. As a result, the programming speed can be increased, and the control electrode voltage and the drain voltage at the time of programming can be decreased.

Preferably, the tunnel oxide film has a thickness of 15 nm or less.

According to this structure, a high electric field is applied to the tunnel oxide film at a relatively low voltage, for example. Therefore, the band-to-band tunnel current can be generated effectively. As a result, high speed programming can be implemented.

Preferably, the non-volatile semiconductor memory device further includes, in the n type region, a fourth p type impurity region formed so as to surround the drain region, and a fifth n type impurity region formed so as to surround the source region.

The fifth impurity region formed in the source region serves to improve the punch-through resistance of the memory cell. The fourth impurity region formed in the drain region serves to improve a breakdown voltage between the drain region and the n type region.

Preferably, the non-volatile semiconductor memory device further includes an open device for bringing the drain region to an open state at the time of erasing.

By this structure, the erasing operation can be carried out stably. As a result, the reliability of operation of the non-volatile semiconductor memory device can be improved.

Preferably, a memory cell is formed of the control electrode, the electric charge storage electrode, the source region, and the drain region, and the non-volatile semiconductor memory device includes a memory cell array including a plurality of memory cells arranged in a plurality of rows and columns, a word line provided corresponding to the plurality of rows, the control electrode of each memory cell being connected to the word line, and a bit line provided corresponding to the plurality of columns, the drain region of each memory cell being connected to the bit line.

By this structure, an NOR flash memory or DINOR type flash memory, for example, formed of a p channel type memory cell can be constituted.

Preferably, the non-volatile semiconductor memory device further includes a peripheral circuit region in which a peripheral circuit controlling operation of the memory cell is formed, the peripheral circuit region having a p channel type MOS transistor, and the source region and the drain region of the memory cell having the same structure as a source region and a drain region constituting the p channel type MOS transistor.

By this structure, the number of masks used in ion injection into the source regions and the drain regions of the memory cell and the transistor formed in the peripheral circuit region can be decreased. As a result, the number of manufacturing steps of the non-volatile semiconductor memory device can be decreased, resulting in cost reduction.

Preferably, the bit line includes a main bit line and a sub-bit line, the plurality of memory cells are divided into a plurality of sectors each including a plurality of memory cells arranged in a plurality of rows and columns, and the non-volatile semiconductor memory device includes a sub-bit line group including a plurality of sub-bit lines each corresponding to a plurality of columns in a corresponding sector, and a select transistor selectively connecting a plurality of sub-bit line groups to a plurality of main bit lines, the select transistor being a p channel type transistor.

By this structure, the select transistor can be formed in the same well as the memory cell.

Preferably, the sub-bit line is formed of a metal interconnection material. By this structure, the contact resistance between the sub-bit line and the drain region can be reduced, as compared to the conventional sub-bit line of a polycrystalline material. Further, by using the metal interconnection material, the interconnection resistance becomes extremely low, whereby the parasitic resistance by the sub-bit line can be suppressed.

Preferably, the negative potential applying device calculates a value $Vd_1$ of Vd satisfying $\{(logId)/vd\}''=0$ when the absolute value of Vd is increased in Vd-Id characteristics (Vd:drain voltage, Id:drain current) at the time of programming of the non-volatile semiconductor memory device, and applies a negative potential satisfying the condition of the absolute value of Vd is smaller than $Vd_1$ to the drain region, so that an avalanche destruction will not occur in a selected memory cell and non-selected memory cells connected to the same bit line as the selected memory cell.

In the conventional non-volatile semiconductor memory device, when such a negative voltage as to cause the avalanche destruction is applied, current consumption in the non-selected memory cells is significantly increased, leading to increase in power consumption of the memory cells. Further, when a programming voltage is generated using a boost circuit in the non-volatile semiconductor memory device, the number of memory cells which can be programmed in parallel is decreased due to the limit in the current supply capability, resulting in reduction of the programming speed per one memory cell. Such problems in the conventional non-volatile semiconductor memory device can be avoided.

Preferably, the memory cell has a threshold voltage lower than a read voltage of the memory cell after erasure with ultraviolet rays.

By this structure, as compared to the case where the threshold voltage is higher than the read voltage, for example, the difference between the threshold voltage of the memory cell in an erased state and the threshold voltage after erasure with ultraviolet rays becomes greater. The resistance to drain disturbance at the time of programming is increased, whereby the reliability of the memory cell can be improved.

Preferably, the memory cell has a threshold voltage higher than the read voltage of the memory cell after erasure with ultraviolet rays.

By this structure, the resistance to disturbance at the time of reading is increased, whereby the reliability of the memory cell can be improved.

In a further aspect of the present invention, a non-volatile semiconductor memory device includes a memory cell having a p type source region and a p type drain region formed in the surface of an n type region, an electric charge storage electrode formed on a channel region sandwiched by the source region and the drain region with a tunnel oxide film therebetween, and a control electrode formed on the electric charge storage electrode with an insulating film therebetween, a memory cell array including a plurality of memory cells arranged in a plurality of rows and columns, a word line provided corresponding to the plurality of rows, the control electrode of each memory cell being connected to the word line, a bit line provided corresponding to the plurality of columns, the drain region of each memory cell being connected to the bit line, a source line to which the -source region of each memory cell is connected, a first potential applying device for applying a first potential to the bit lines and the word lines which are not selected, the source line, and the n type region in reading data in a predetermined one of the memory cells, a second potential applying device for applying a potential lower than the first potential by 1 to 2 V to the selected bit line in reading data in the predetermined memory cell, and a third potential applying device for applying a second potential to the word line which is selected in reading data in the predetermined memory cell.

According to this structure, the reading operation of a so-called NOR type flash memory of a p channel type can be carried out by using the first and second potentials of two kinds.

According to a further aspect of the present invention, a non-volatile semiconductor memory device includes a memory cell having a p type source region and a p type drain region formed in the surface of an n type region, an electric charge storage electrode formed on a channel region sandwiched by the source region and the drain region with a tunnel oxide film therebetween, and a control electrode formed on the electric charge storage electrode with an insulating film therebetween, a memory cell array including a plurality of memory cells arranged in a plurality of rows and columns, a plurality of main bit lines provided corresponding to the plurality of columns, and a source line provided in common to the plurality of memory cells, the plurality of memory cells being divided into a plurality of sectors each including a plurality of memory cells arranged in a plurality of rows and columns, a plurality of sub-bit line groups provided corresponding to the plurality of sectors and including a plurality of sub-bit lines each corresponding to a plurality of columns in a corresponding sector, a select gate transistor selectively connecting the plurality of sub-bit line groups to the plurality of main bit lines, a first potential applying device applying a first potential to the main bit lines and the select gate transistor which are not selected, the source line, and the n type region in reading data in a predetermined one of the memory cells, a second potential applying device for applying a potential lower than the first potential by 1 to 2 V to the main bit line and the sub-bit line which are selected in reading data in the predetermined memory cell, an open device for bringing non-selected sub-bit lines to an open state in reading data in the predetermined memory cell, and a third potential applying device for applying a second potential to the select gate transistor which is selected in reading data in the predetermined memory cell.

According to this structure, the reading operation of a p channel type DINOR type flash memory can be carried out by using two kinds of potentials.

Preferably, the first potential is a ground potential, and the second potential is an external power supply potential having a negative value.

By using only an external power supply potential having a positive value in the memory cell, the reading operation of a p channel type NOR or DINOR type flash memory can be carried out.

Preferably, the first potential is a ground potential, and the second potential is an external power supply potential having a negative value.

As a result, by using one external power supply potential having a negative value in the memory cell, the reading operation of a p channel type NOR or DINOR type flash memory can be carried out.

Preferably, when data is programmed into the non-volatile semiconductor memory device, the program voltage application condition is set so that the drain current which is a current consumed most at the time of programming is 1 μA or less.

As a result, at least 1000 memory cells, for example, can be simultaneously programmed in parallel, making it possible to increase the effective programming speed per one memory cell.

Further, a non-volatile semiconductor memory device which operates based on a single power source can be fabricated.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 26 is a diagram showing Id-Vd characteristics and Ig-Vd characteristics of a non-volatile semiconductor memory device according to a fifteenth embodiment.

FIG. 27 is a first diagram for describing an avalanche phenomenon in the fifteenth embodiment.

FIG. 28 is a second diagram for describing the avalanche phenomenon in the fifteenth embodiment.

FIG. 36 is a diagram showing a voltage application condition of the conventional DINOR type memory cell.

FIG. 37 is a diagram showing programming characteristics of the conventional DINOR type memory cell.

DESCRIPTION OF THE PREFERRED EMBODIMENTS (First Embodiment)

The first embodiment of the present invention will be described hereinafter with reference to the drawings. A structure of a non-volatile semiconductor memory device according to the first embodiment will first be described with reference to FIG. 1.

Figure 1:
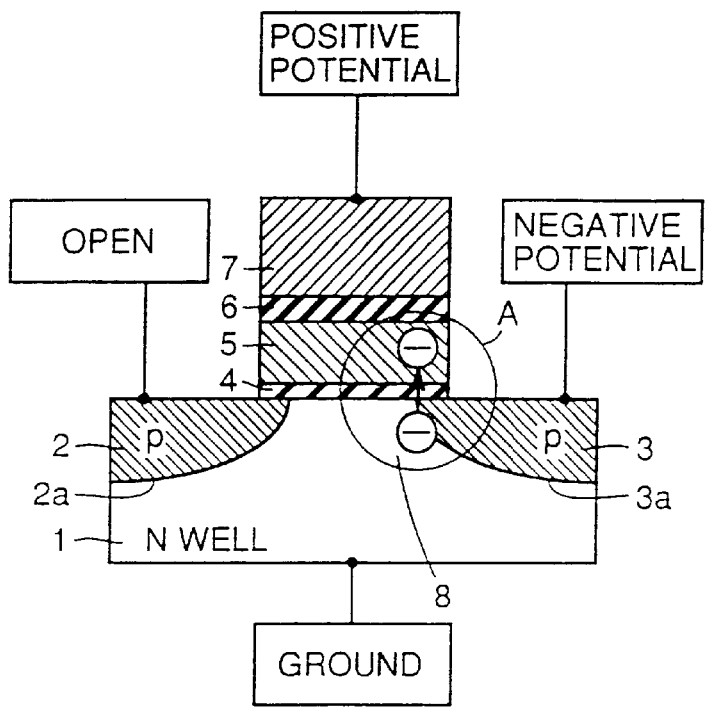
FIG. 1 is a first diagram for describing programming operation of a non-volatile semiconductor memory device according to a first embodiment.

The non-volatile semiconductor memory device according to the present embodiment includes a p type source region 2 and a p type drain region 3 formed in the surface of an n type well 1. In FIG. 1, pn junctions 2a and 3a are formed at boundaries between source region 2 and n well 1, and between drain region 3 and n well 1, respectively.

A floating gate electrode 5 is formed on a channel region 8 sandwiched by source region 2 and drain region 3 with a tunnel oxide film 4 therebetween. A control gate electrode 7 is formed on floating gate electrode 5 with an insulating film 6 therebetween. Note that a three-layered film of an oxide film, a nitride film, and an oxide film is generally used as insulating film 6.

Programming, erasing, and reading operation of the non-volatile semiconductor memory device of the above structure will be described.

Figures 3, 4:
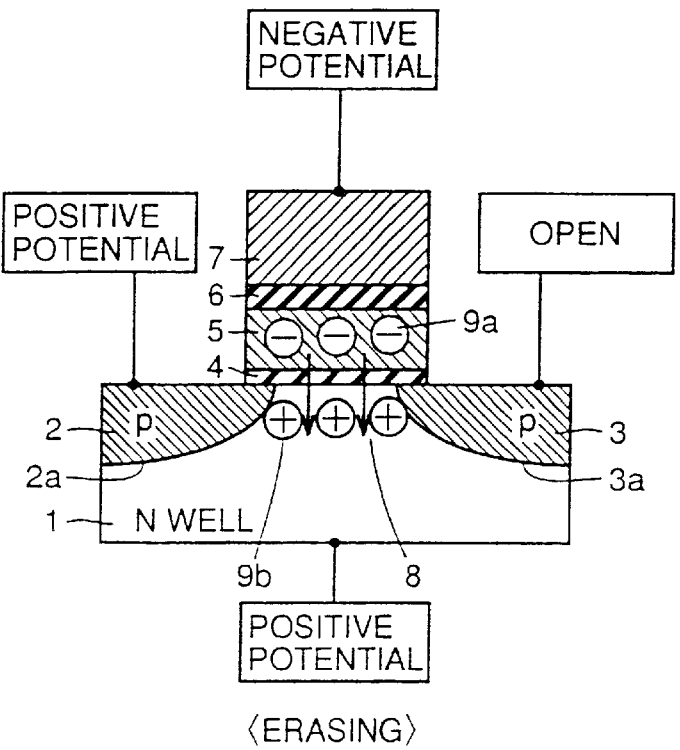
FIG. 3 is a diagram for describing erasing operation of the non-volatile semiconductor memory device according to the first embodiment.
FIG. 4 is a diagram showing a voltage application condition of the non-volatile semiconductor memory device according to the first embodiment.

Referring to FIGS. 1 and 4, in the programming operation, a positive potential of approximately 4 to 11 V is applied to control gate electrode 7, a negative potential of approximately −3 to −10 V is applied to drain region 3, source region 2 is in an open state, and n well 1 is at a ground potential. More specifically, potentials are applied in a potential arrangement of polarities opposite to those of the programming operation of a DINOR type flash memory cell using a conventional n channel type MOS transistor.

Figure 2:
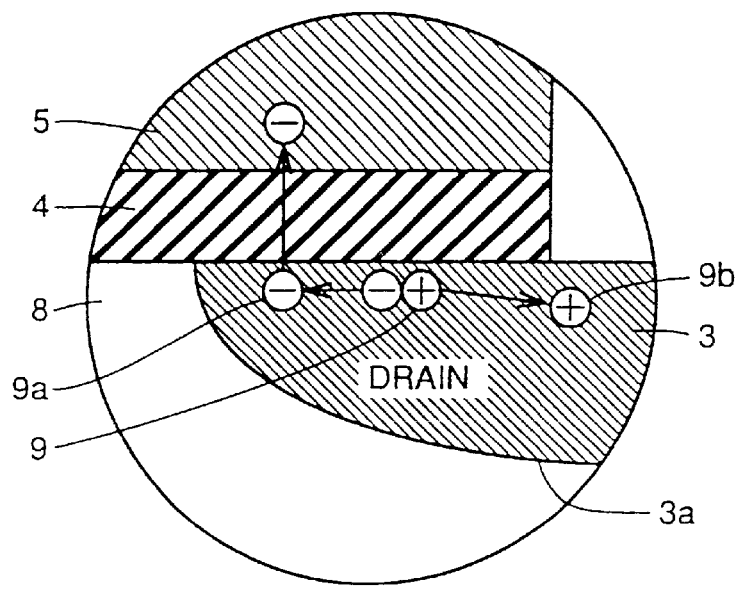
FIG. 2 is a second diagram for describing programming operation of the non-volatile semiconductor memory device according to the first embodiment.

FIG. 2 is a schematic diagram showing the programming operation in a region shown by A of FIG. 1 at this time.

A band-to-band tunnel current is generated in drain region 3 to produce an electron-hole pair 9. An electron 9a of the pair is accelerated in the direction of channel region 8 by a lateral electric field, to be formed into a hot electron having high energy. Since a positive potential is applied to control gate electrode 7 at this time, this hot electron 9a can be easily injected into tunnel oxide film 4 to reach floating gate electrode 5. Electrons are injected into floating gate electrode 5 by this hot electron injection induced by the band-to-band tunnel current, and the programming operation to a memory cell in the present embodiment is carried out.

According to this programming operation, the threshold value of a memory cell is "Low Vt" (low Vth state). Since the memory cell is a p channel type transistor, the threshold value has a small absolute value in a negative sign.

The erasing operation will now be described with reference to FIGS. 3 and 4. In the erasing operation, a negative potential of approximately −5 to −12 V is applied to control gate electrode 7, a positive potential of approximately 5 to 12 V is applied to source region 2 and n well 1, and drain region 3 is in an open state. More specifically, a channel layer of holes is formed in channel region 8 by a potential arrangement of polarities opposite to those in the erasing operation of the DINOR type flash memory cell using the n channel type MOS transistor. Because of the above described potential arrangement, a strong electric field is applied to tunnel oxide film 4 between the channel layer and floating gate electrode 5. Electrons are ejected from floating gate electrode 5 to the channel layer by an FN tunneling phenomenon. This erasing operation brings the threshold value of the memory cell to "High Vt" (high Vth state). Since the memory cell is a p channel type transistor, the threshold value has a large absolute value in a negative sign.

In the reading operation, as shown in FIG. 4, a negative potential of approximately −1.5 to −5 V which is approximately intermediate between "Low Vt" and "High Vt" is applied to control gate electrode 7, source region 2 and n well 1 are grounded, and a negative potential of approximately −0.1 to −2 V is applied to drain region 3.

Depending on whether current flows through the non-volatile semiconductor memory device in this potential arrangement, it is determined whether the threshold value of the non-volatile semiconductor memory device is "Low Vt".

Figure 5:
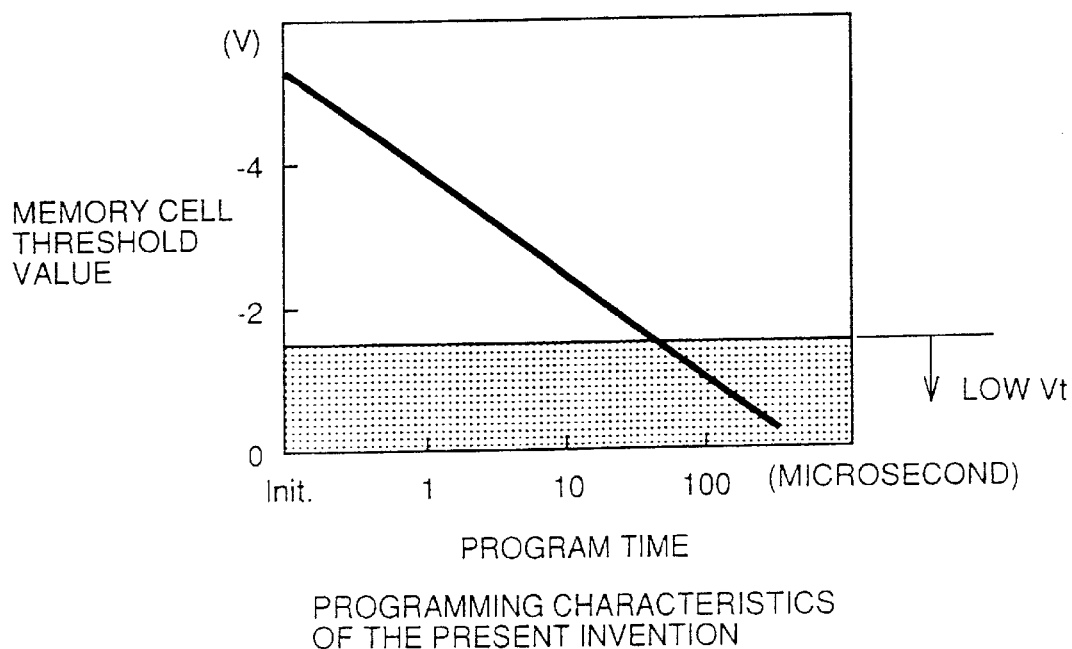
FIG. 5 is a diagram showing programming characteristics of the non-volatile semiconductor memory device according to the first embodiment.
Figure 6:
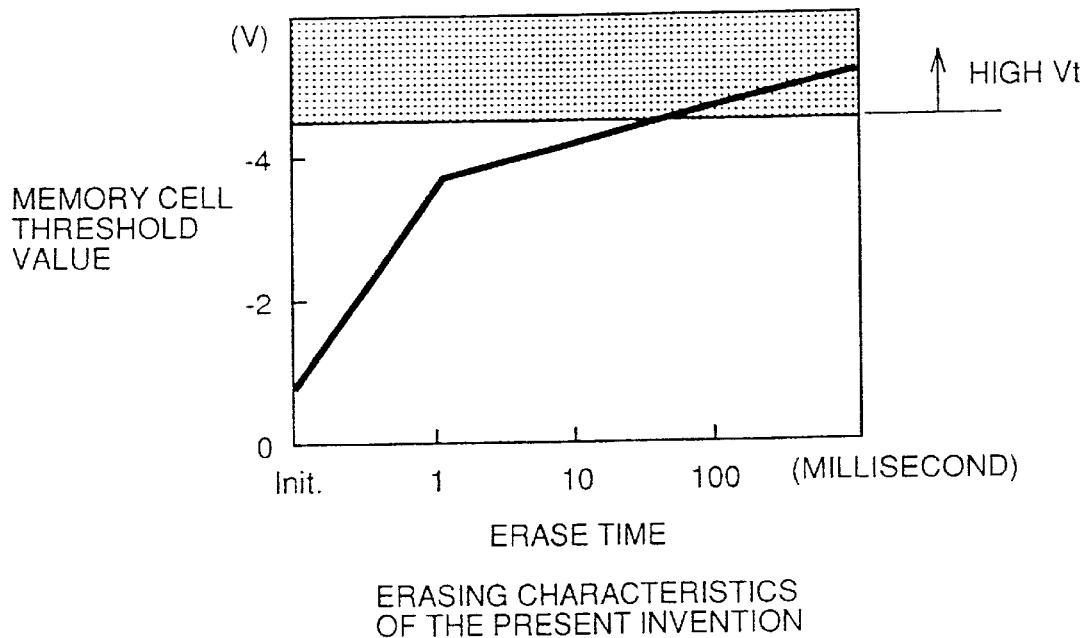
FIG. 6 is a diagram showing erasing characteristics of the non-volatile semiconductor memory device according to the first embodiment.

FIGS. 5 and 6 show programming characteristics and erasing characteristics of the non-volatile semiconductor memory device according to the present embodiment.

Figure 38:
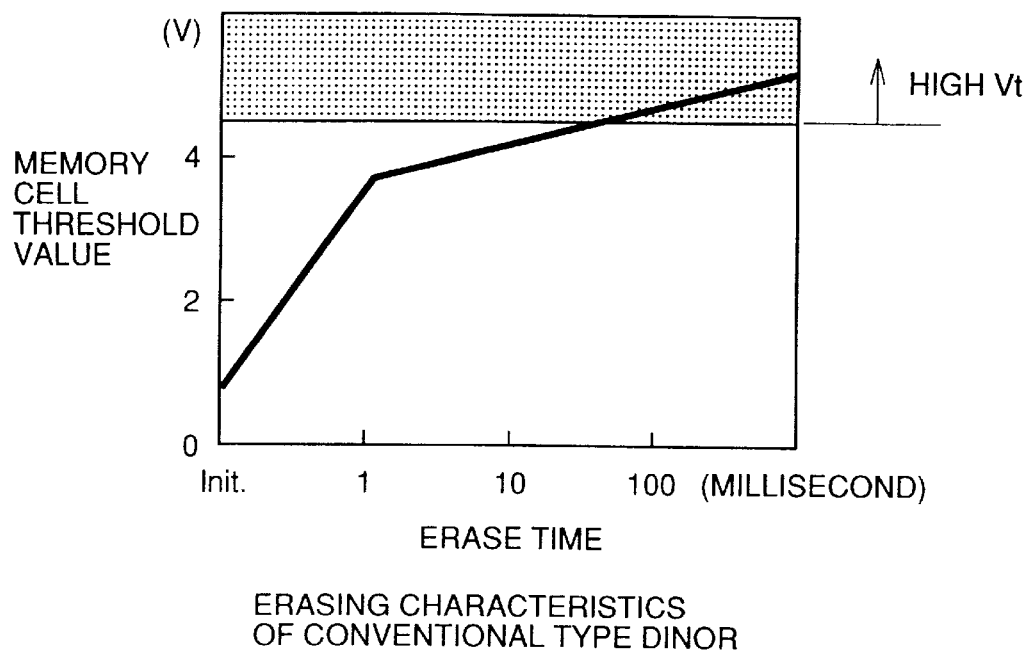
FIG. 38 is a diagram showing erasing characteristics of the conventional DINOR type memory cell.
Figure 39:
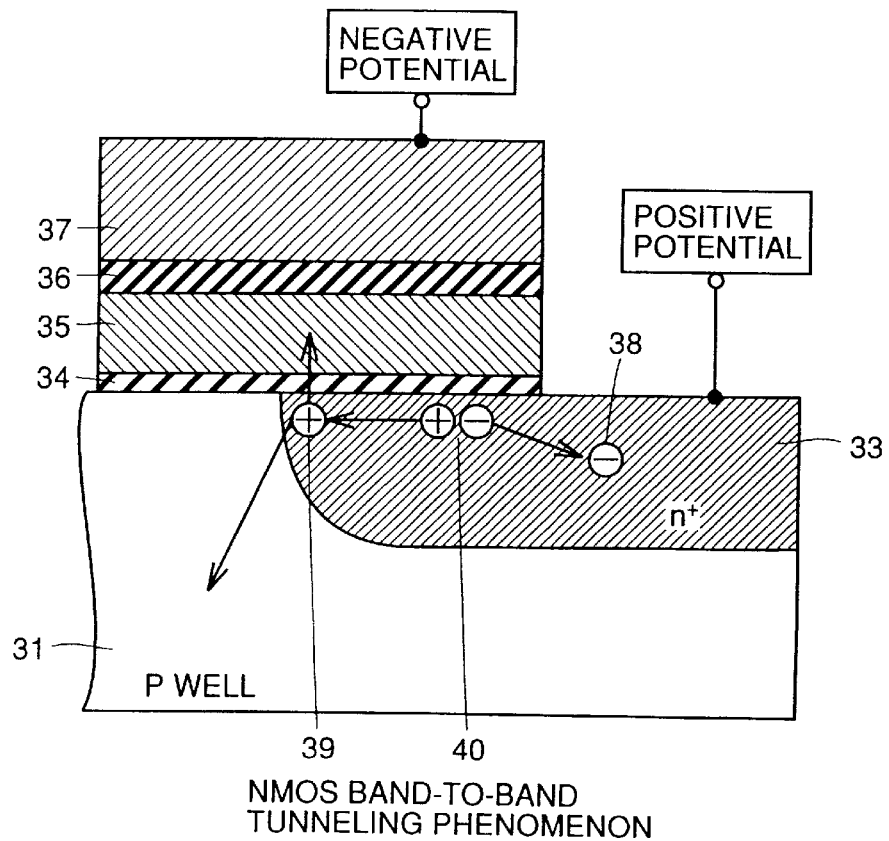
FIG. 39 is a schematic diagram for describing a band-to-band tunneling phenomenon in a conventional n channel type MOS memory cell.
Figure 40:
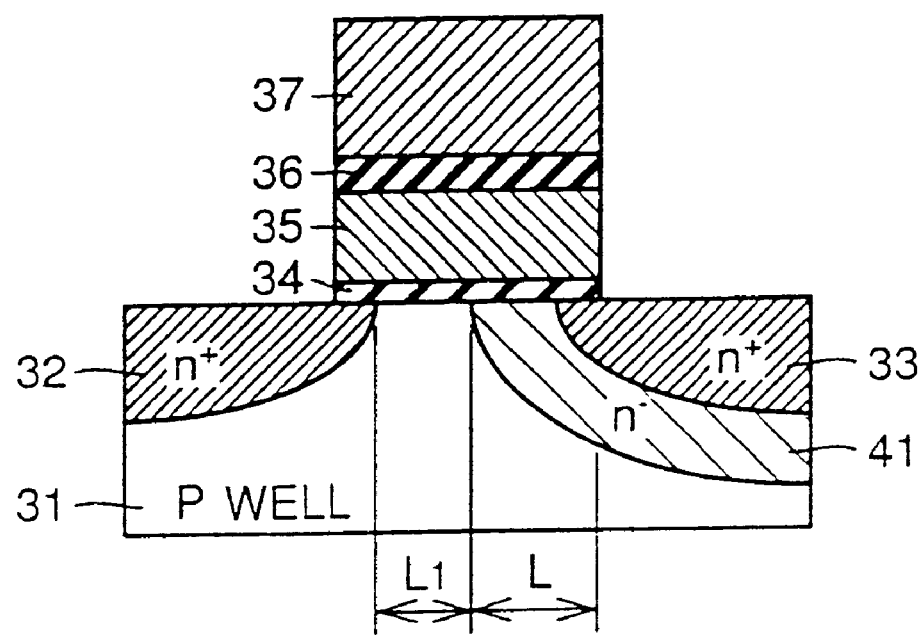
FIG. 40 is a sectional view showing an improved structure of the conventional n channel type MOS memory cell.

It is found that the threshold value is negative both in the programming characteristics and in the erasing characteristics of the present embodiment, as compared to the prior art shown in FIGS. 37 and 38.

As described above, in the non-volatile semiconductor memory device in the present embodiment, the memory cell is formed of a p channel type MOS transistor, and the programming, erasing, and reading operations are carried out under such potential conditions as shown in FIG. 4.

Therefore, in the programming operation, a hole 9b of electron-hole pair 9 generated by the band-to-band tunnel current in the vicinity of drain region 3 is drawn to drain region 3. Further, the hole is not formed into a hot hole having high energy unlike the conventional case, since the high hole concentration in drain region 3 causes the hole to scatter and to be deprived of energy. Even if there is a hot hole, the hot hole cannot be injected into tunnel oxide film 41 since floating gate electrode 5 is at a positive potential.

Therefore, a marked deterioration of the tunnel oxide film caused by injection of hot holes into the tunnel oxide film, which is a serious problem in the conventional n channel MOS type memory cell, can be prevented, Since hot holes are not injected into the tunnel oxide film, it is not necessary to form such an electric field relaxation layer as in the conventional case. Therefore, as compared to the structure of the conventional n channel MOS type memory cell, a longer effective gate length is secured and memory cells can be more miniaturized in the present invention, allowing high integration.

Figure 7:
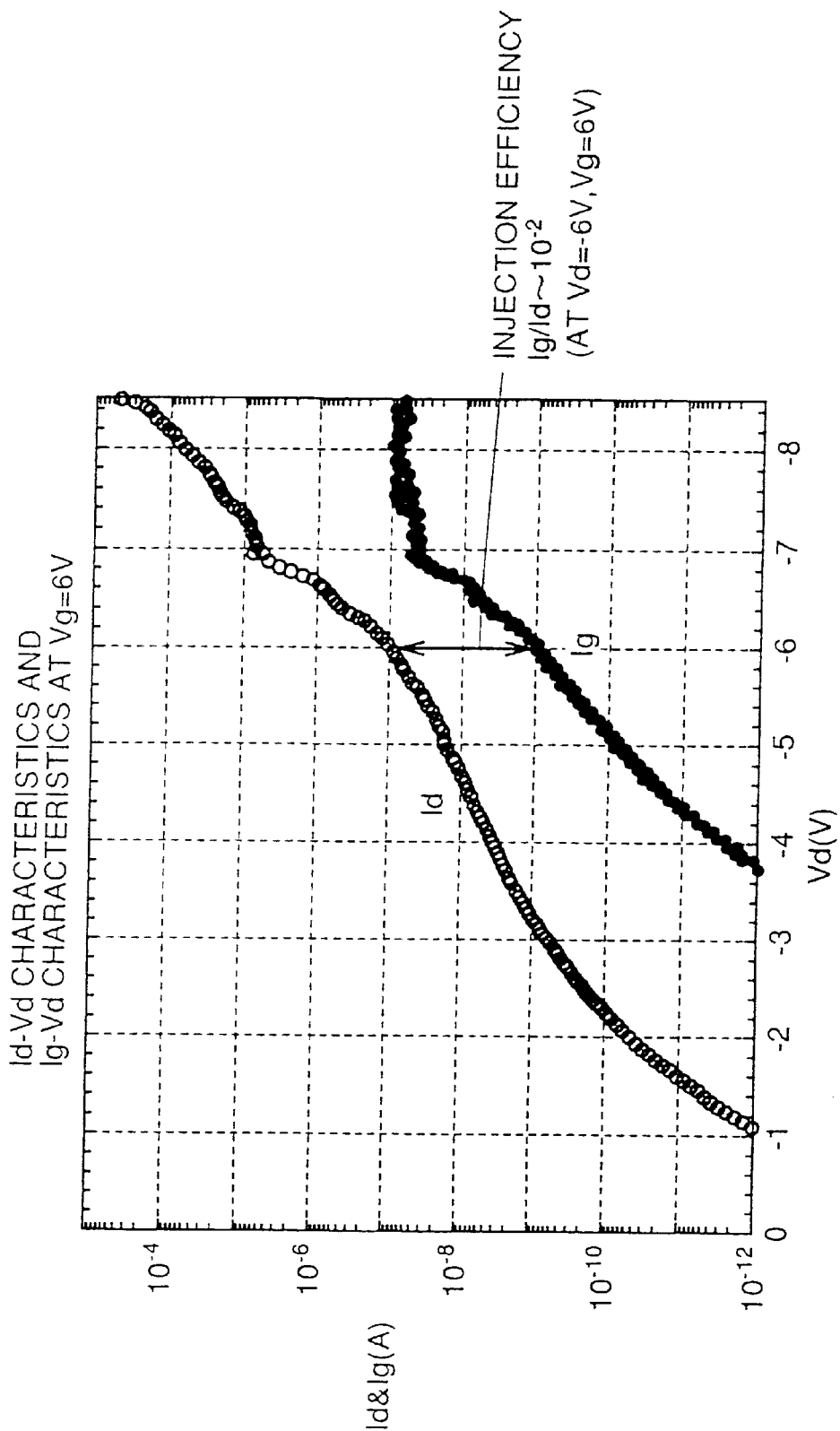
FIG. 7 is a diagram showing Id-Vd characteristics and Ig-Vd characteristics when a floating gate and a control gate are connected in the first embodiment.

Referring to FIG. 7, Id-Vd characteristics and Ig-Vd characteristics will be described in the case where floating gate electrode 5 and control gate electrode 7 are connected in the structure shown in FIG. 1. Note that Id denotes a value of current generated by the band-to-band tunneling phenomenon, and Ig denotes a value of current injected into tunnel oxide film 4 by hot electrons induced by the band-to-band tunnel current. Vg denotes voltage of control gate electrode 7.

When consideration is given to an injection efficiency Ig/Id under conditions of Vd=−6 V and Vg=6 V, which are close to actual use conditions, a high injection efficiency of approximately $10^{-2}$ is obtained as shown in FIG. 7.

In the programming operation according to the present embodiment, the injection efficiency Ig/Id is better by one to two digits than a ratio Ig/Id of a gate current Ig generated by the FN tunneling phenomenon to a leakage current Id generated by a band-to-band tunneling phenomenon of the conventional n channel MOS type memory cell in which the programming operation is carried out by ejection of electrons from the floating gate electrode to the drain region by the FN tunnel current.

As described above, the higher injection efficiency Ig/Id than that of the conventional memory cell allows the programming operation to be carried out at the same speed as that of the conventional case and with a lower current consumption than the conventional case. This means that the programming operation can be carried out at a higher speed with the same amount of current consumption as the conventional case.

According to the programming operation of the non-volatile semiconductor memory device of the present embodiment, deterioration of the tunnel oxide film can be prevented, and the gate length is effectively used. Further, low current consumption and high speed programming can be implemented (cf. S. Haddad et al., "An Investigation of Erase-Mode Dependent Hole Trapping in Flash EEPROM Memory Cell," IEEE ELECTRON DEVICE LETTERS, (Vol. 11, No. 11, November 1990): 514.

Further, since source region 2 and drain region 3 are structured in symmetry with respect to floating gate electrode 5 and control gate electrode 7 as shown in FIG. 1, source region 2 and drain region 3 can be formed by the same impurity implantation step. As a result, as compared to the conventional DINOR type flash memory cell and the NOR type flash memory cell having a source region and a drain region structured in asymmetry, the number of masks and the number of the manufacturing steps can be reduced, leading to reduction of the manufacturing cost of the non-volatile semiconductor memory device.

(Second Embodiment)

The second embodiment of a non-volatile semiconductor memory device according to the present invention will now be described.

The non-volatile semiconductor memory device of the second embodiment is a DINOR type flash memory using a p channel MOS type memory cell implemented with the memory cell in the above described first embodiment.

A memory cell matrix included in this DINOR flash memory is divided into a plurality of sectors as described hereinafter. Tables 1 to 3 show voltage application conditions to memory cells (memory transistors) in a selected sector and memory cells (memory transistors) in non-selected sectors. In Tables 1 to 3, Vd denotes a drain voltage, Vg denotes a control gate electrode voltage, Vs denotes a source region voltage, and Vbb denotes an n well voltage. For simplicity of description, the number of sectors, the number of memories and the like are small in the voltage conditions in Tables 1 to 3.

TABLE 1

Applied Voltages in Erasing

| Applied voltages in selected sectors | | | | Applied voltages in non-selected sectors | | | |
| --- | --- | --- | --- | --- | --- | --- | --- |
| Vd | Vcg | Vs | Vbb | Vd | Vcg | Vs | Vbb |
| open | −10 V | 8 V | 8 V | open | 0 V | 8 V | 8 V |

TABLE 2

Applied Voltages in Programming

| Applied voltages in selected sectors | | | | Applied voltages in non-selected sectors | | | |
| --- | --- | --- | --- | --- | --- | --- | --- |
| Vd | Vcg | Vs | Vbb | Vd | Vcg | Vs | Vbb |
| −5 V | 8 V | open | 0 V | open | 0 V | 0 V | 0 V |

TABLE 3

Applied Voltages in Reading

| Applied voltages in selected sectors | | | | Applied voltages in non-selected sectors | | | |
| --- | --- | --- | --- | --- | --- | --- | --- |
| Vd | Vcg | Vs | Vbb | Vd | Vcg | Vs | Vbb |
| 2 V | 0 V | 3 V | 3 V | open | 3 V | 3 V | 3 V |

(a) Whole structure of non-volatile semiconductor memory device

Figure 8:
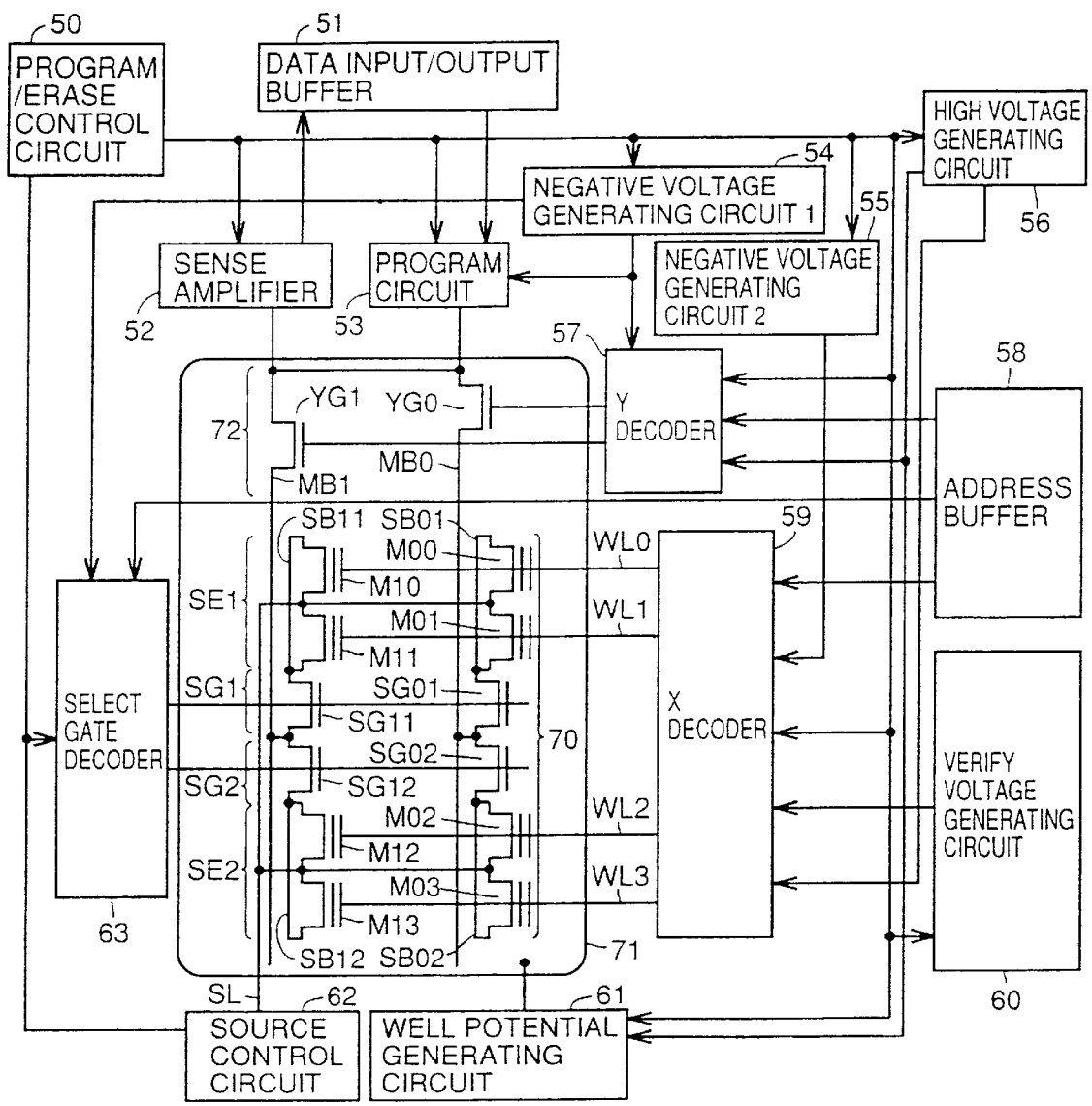
FIG. 8 is a block diagram showing a structure of a non-volatile semiconductor memory device according to a second embodiment.

FIG. 8 is a block diagram showing the whole structure of a non-volatile semiconductor memory device according to the present embodiment.

A memory cell matrix 70 is divided into sectors SE1 and SE2. Memory cell matrix 70 includes select gates SG1 and SG2 corresponding to sectors SE1 and SE2, respectively. Memory cell matrix 70 is formed in an n well region 71.

In memory cell matrix 70, two main bit lines MB0 and MB1 are arranged. Main bit lines MB0 and MB1 are connected to a sense amplifier 52 and a program circuit 53 through Y gate transistors YG0 and YG1 in a Y gate 72.

Two sub-bit lines SB01 and SB02 are provided corresponding to main bit line MB0. Two sub-bit lines SB11 and SB12 are provided corresponding to main bit line MB1.

Word lines WL0 and WL1 are arranged so as to cross sub-bit lines SB01 and SB11. Word lines WL2 and WL3 are arranged so as to cross sub-bit lines SB02 and SB12. Here, by using an interconnection structure in which a metal material such as a refractory metal material of Al and tungsten and a silicide material of the refractory metal material is used as a material of the sub-bit line, a contact resistance with a $p^+$ diffusion layer can be made sufficiently small, as compared to an interconnection structure using polysilicon as a material of the sub-bit line. Further, the small interconnection resistance can suppress the parasitic resistance caused by the sub-bit line.

Memory cells (memory transistors) M00 to M03 and M10 to M13 are provided at crossing points between sub-bit lines SB01, SB02, SB11, SB12 and word lines WL0 to WL3. Memory cells M00, M01, M10, and M11 are included in sector SE1, and memory cells M02, M03, M12, and M13 are included in sector SE2.

Each memory cell has its drain region connected to a corresponding sub-bit line, its control gate electrode connected to a corresponding word line, and its source region connected to a source line SL.

Select gate SG1 includes select gate transistors SG01 and SG11. Select gate SG2 includes select gate transistors SG02 and SG12. Sub-bit lines SB01 and SB02 are connected to main bit line MB0 through select gate transistors SG01 and SG02, respectively, and sub-bit lines SB11 and SB12 are connected to main bit line NB1 through select gate transistors SG11 and SG12, respectively.

An address buffer 58 receives externally applied address signals, and applies an X address signal and a Y address signal to an X decoder 59 and a Y decoder 57, respectively. X decoder 59 selects any of a plurality of word lines WL0 to WL3 in response to the X address signal. Y decoder 57 generates a select signal selecting any of a plurality of main bit lines MB0 and MB1 in response to the Y address signal. The Y gate transistors in Y gate 72 connect main bit lines MB0 and MB1 to sense amplifier 52 and program circuit 53 in response to the select signal, respectively.

In the reading operation, sense amplifier 52 senses data read out onto main bit line MB0 or main bit line MB1, and externally outputs the data through a data input/output buffer 51.

In the programming operation, externally applied data is given to program circuit 53 through data input/output buffer 51, and program circuit 53 applies a program voltage to main bit lines MB0 and MB1 according to the data.

Negative voltage generating circuits 54 and 55 receive a power supply voltage Vcc (for example 5 V) from the outside world, and generates a negative voltage. A high voltage generating circuit 56 receives the power supply voltage Vcc from the outside world, and generates a high voltage. A verify voltage generating circuit 60 receives the externally applied power supply voltage Vcc, and applies a prescribed verify voltage to a selected word line at the time of verification. A well potential generating circuit 61 applies a positive voltage to n well region 71 at the time of erasing. A source control circuit 62 applies a high voltage to source line SL at the time of erasing. A select gate decoder 63 selectively activates select gates SG1 and SG2 in response to some of address signals from an address buffer 53.

A program/erase control circuit 50 controls operation of each circuit in response to an externally applied control signal.

(b) Operation of non-volatile semiconductor memory device

A sector erasing operation, a programming operation, and a reading operation of the non-volatile semiconductor memory device will now be described with reference to Tables 1 to 3.

(i) Sector erasing operation

Assume here that the entire sector SE1 is erased. First, a control signal specifying an entire sector erasing operation is applied to program/erase control circuit 50. In response to this signal, negative voltage generating circuit 55 and high voltage generating circuit 56 are activated.

Negative voltage generating circuit 55 applies a negative voltage (−10 V) to X decoder 59. X decoder 59 applies a negative voltage (−10 V) to word lines WL0 and WL1 of sector SE1, and 0 V to word lines WL2 and WL3 of sector SE2. High voltage generating circuit 56 applies a high voltage to Y decoder 57 and well potential generating circuit 61. Y decoder 57 applies a high voltage to Y gate transistors YG0 and YG1 in Y gate 72 (an example is shown where the Y gate transistors and the select gate transistor are formed of p channel type MOS transistors). As a result, main bit lines MB0 and MB1 are brought to a floating state. Source control circuit 62 applies a positive voltage (8 V) to source line SL. Further, well potential generating circuit 61 applies a positive voltage (8 V) to n well region 71. Select gate decoder 63 turns select gates SG1 and SG2 off.

Thus, voltages are applied to memory cells in selected sector SE1 and memory cells in non-selected sector SE2 as shown in Table 1. As a result, all the memory cells in sector SE1 are erased.

(ii) Programming operation

Here, assume that memory cell M00 is programmed. More specifically, data "0" is programmed in memory cell M00, and data "1" is latched in memory cell M10.

A control signal specifying the programming operation is applied to program/erase control circuit 50. In response to this signal, negative voltage generating circuit 54 and high voltage generating circuit 56 are activated.

High voltage generating circuit 56 applies a high voltage to X decoder 59. X decoder 59 selects word line WL0 in response to the X address signal applied from address buffer 58, applies a high voltage (8 V) to selected word line WL0, and applies 0 V to non-selected word lines WL1 to WL3.

Negative voltage generating circuit 54 applies a negative voltage to Y decoder 57, program circuit 53, and select gate decoder 63. First, data "0" is externally applied to program circuit 53 through data input/output buffer 51 to be latched. In response to the Y address signal applied from address buffer 58, Y decoder 57 applies a negative voltage to Y gate transistor YG0 in Y gate 72, and applies 0 V to Y gate transistor YG1. Accordingly, Y gate transistor YG0 is turned on.

Program circuit 53 applies a program voltage (−5 V) corresponding to data "0" to main bit line MB0 through Y gate transistor YG0. Select gate decoder 63 turns select gate SG1 on, and select gate SG2 off. As a result, sub-bit lines SB01 and SB11 are connected to main bit lines MB0 and MB1, respectively. Source control circuit 62 brings source line SL to a floating state. Well potential generating circuit 61 applies 0 V to n well region 71.

Thus, voltages are applied to memory cell M00 as shown in the left column of Table 2. As a result, the threshold voltage of memory cell M00 increases (since the threshold voltage is negative, it changes towards 0).

After a prescribed time, for example, 1 msec, data "1" is externally applied to program circuit 53 through data input/output buffer 51 to be latched. In response to the Y address signal applied from address buffer 58, Y decoder 57 applies a negative voltage to Y gate transistor YG1 in Y gate 72, and 0 V to Y gate transistor YG0. As a result, Y gate transistor YG1 is turned on. Program circuit 53 applies 0 V corresponding to the data "1" to main bit line MB1 through Y gate transistor YG1.

Thus, voltages are applied to memory cell M10 as shown in the right column of Table 2. As a result, the threshold voltage of memory cell M10 remains low (since the threshold voltage is negative, its absolute value is high).

(iii) Reading operation

Here, assume that data is read out from memory cell M00. First, a control signal specifying the reading operation is applied to program/erase control circuit 50.

In response to the X address signal applied from address buffer 58, X decoder 59 selects word line WL0 and applies 0 V to the word line. At this time, word lines WL1 to WL3 are kept at 3 V. Select gate decoder 63 turns select gate SG1 on, and select gate SG2 off. In response to the Y address signal applied from address buffer 58, Y decoder 57 turns Y gate transistor YG0 in Y gate 72 on. Source control circuit 62 applies 3 V to source line SL. Well potential generating circuit 61 applies 3 V to n well region 71.

Thus, voltages are applied to selected memory cell M00 as shown in the left column of Table 3. As a result, if the content of memory cell M00 is "1", main bit line MB0 is supplied with a read current. This read current is sensed by sense amplifier 52, and provided externally through data input/output buffer 51. At this time, voltages are applied to non-selected memory cells as shown in the right column of Table 3.

As described above, the erasing, programming, and reading operations of the non-volatile semiconductor memory device of the present embodiment can be carried out.

In the non-volatile semiconductor memory device of the present embodiment, a band-to-band tunnel current is generated in the drain region by applying a positive potential to the control gate electrode and a negative potential to the drain region in the p channel MOS type memory cell. This band-to-band tunnel current generates an electron. The electron is accelerated by an electric field to be formed into a hot electron. By the hot electron being injected into the tunnel oxide film, the programming operation is carried out.

In the programming operation, a positive voltage Vcg is applied to the control gate electrode, and a negative voltage Vd is applied to the drain region in the selected memory cell. On the other hand, 0 V is applied to the control gate electrode, and the negative voltage Vd is applied to the drain region in the non-selected memory cells (cells affected by drain disturbance) connected to the same bit line. In the non-selected memory cells, the potential difference between the floating gate electrode and the drain region becomes much smaller than the potential difference between the floating gate electrode and the drain region of the selected memory cell, since the control gate voltage is 0 V. Thus, in the non-selected memory cells, the amount of generation of the band-to-band tunnel current is decreased, causing the electron injection current to be decreased. (In the non-selected memory cells (cells affected by gate disturbance) connected to the same word line, the control gate voltage is a positive voltage (Vcg) and the drain region voltage is 0 V.

This state is the same erroneous erasing mode caused by the FN tunnel current as is the case of the conventional n channel MOS type memory cell affected by gate disturbance. In this mode, no problem arises unless Vcg is set at an extremely large value).

As described above, only a memory cell to which both a positive voltage to the control gate electrode and a negative voltage to the drain region are simultaneously applied has an increased electron injection current and allows a high speed programming operation. In a memory cell to which only one of a positive voltage to the control gate electrode and a negative voltage to the drain region is applied, the programming operation or erasing operation is not carried out. More specifically, a characteristic is used that the amount of generation of the band-to-band tunnel current is determined by the magnitude of the potential difference between the floating gate electrode and the drain region. As described above, effective use of the band-to-band tunnel phenomenon is the characteristic of the programming operation of the present embodiment.

By using the p channel MOS memory cells in the DINOR type flash memory, the source region and the drain region of a p channel transistor formed in a peripheral circuit region and those of a memory cell region can be formed similar in structure. Therefore, it is possible to implant impurities into the source and drain regions in the memory cell region and those in the peripheral circuit region in the same manufacturing step. As a result, the number of masks and the number of manufacturing steps of the non-volatile semiconductor memory device can be decreased, making it possible to reduce the manufacturing cost.

Further, a select transistor formed in a memory cell array can be of a p channel transistor. Therefore, the p channel type MOS memory cell and the select transistor can be formed in the same well.

(Third Embodiment)

The third embodiment of a non-volatile semiconductor memory device according to the present invention will now be described.

The non-volatile semiconductor memory device according to the third embodiment is an NOR type flash memory implemented using a structure of the p channel MOS type memory cell according to the first embodiment.

Figure 9:
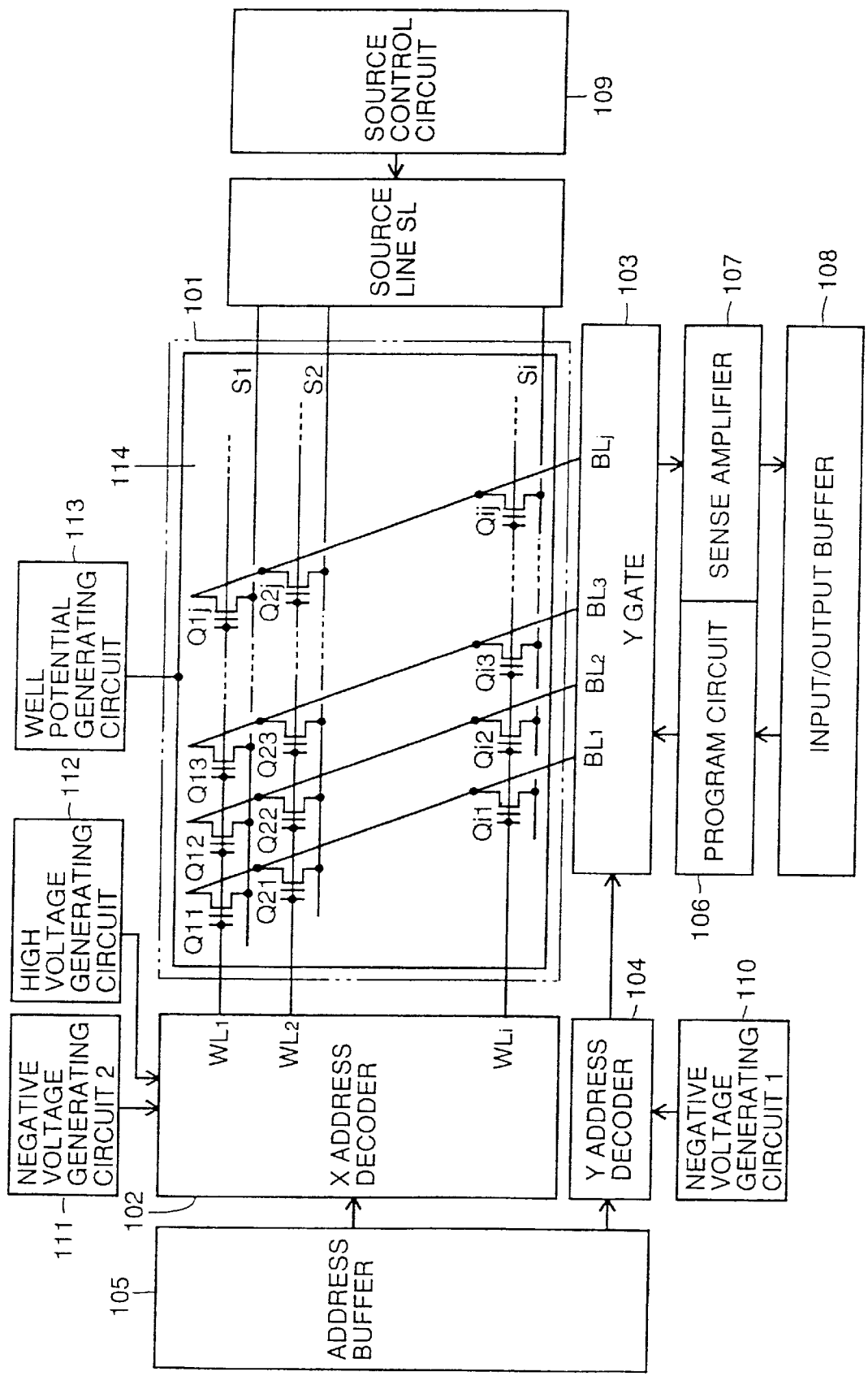
FIG. 9 is a block diagram showing a structure of a non-volatile semiconductor memory device according to a third embodiment.

Referring to FIG. 9, a structure of the non-volatile semiconductor memory device according to the present embodiment will first be described. A flash memory according to this embodiment, which employs entire chip erasing, includes a memory cell matrix 101, an X address decoder 102, an address buffer 105, a program circuit 106, a sense amplifier 107, an input/output buffer 108, a source control circuit 109, negative voltage generating circuits 110 and 111, a high voltage generating circuit 112, and a well potential generating circuit 113.

Memory cell matrix 101 has a plurality of memory transistors arranged in rows and columns therein. Memory cell matrix 101 is formed in an n well region 114. X address decoder 102 and a Y gate 103 are connected in order to select rows and columns of memory cell matrix 101. A Y address decoder 104 supplying column select information is connected to Y gate 103. Address buffer 105 in which address information is temporarily stored is connected to X address decoder 102 and Y address decoder 104.

Program circuit 106 for carrying out the programming operation upon data input and sense amplifier 107 determining "0" or "1" based on a value of a current flowing upon data output are connected to Y gate 103. Input/output buffer 108 temporarily storing input/output data is connected to program circuit 106 and sense amplifier 107.

In memory cell matrix 101 shown in FIG. 9, an equivalent circuit diagram showing the schematic structure is shown. A flash memory having this memory cell matrix 101 is called an NOR type flash memory.

In memory cell matrix 101, a plurality of word lines $WL_1$, $WL_2$, ..., $WL_i$ extending in the row direction, and a plurality of bit lines $BL_1$, $BL_2$, ..., $BL_j$ extending in the column direction are arranged orthogonal to each other. These lines form a matrix. Memory transistors $Q_{11}$, $Q_{12}$, ..., $Q_{ij}$ each having a floating gate are provided at crossing points between the word lines and the bit lines. Each bit line is connected to the drain regions of corresponding memory transistors. Each word line is connected to the control gate electrodes of corresponding memory transistors. Each of source lines $S_1$, $S_2$ ..., is connected to the source regions of corresponding memory transistors. The sources of memory transistors belonging to the same row are connected to each other as shown in FIG. 9.

High voltage generating circuit 112 receives the power supply voltage Vcc (for example, 3 V) from the outside world, and generates a high voltage. Negative voltage generating circuits 110 and 111 receive the power supply voltage Vcc from the outside world, and generates a negative voltage. Well potential generating circuit 113 applies a high voltage to n well region 114. Source control circuit 109 applies a high voltage to source line SL at the time of erasing.

The erasing operation, the programming operation, and the reading operation will now be described with reference to Tables 4 to 6. Values in voltage application conditions shown in Tables 4 to 6 are by way of example.

TABLE 4

Applied Voltages in Erasing

| bit line | word line | source line | N well |
|---|---|---|---|
| open | −10 V | 8 V | 8 V |

TABLE 5

Applied Voltages in Programming

| bit line | word line | source line | N well |
|---|---|---|---|
| −5 V | 8 V | open | 0 V |

TABLE 6

Applied Voltages in Reading

| bit line | word line | source line | N well |
|---|---|---|---|
| 2 V | 0 V | 3 V | 3 V |

(i) Erasing operation

Negative voltage generating circuit 111 applies a negative voltage (−10 V) to X address decoder 102. X address decoder 102 applies a negative voltage (−10 V) to all the word lines $WL_1$ to $WL_i$. Well potential generating circuit 113 applies a high voltage (8 V) to n well region 114. Source control circuit 109 applies a high voltage (8 V) to source line SL. Y address decoder 104 turns Y gate transistors in Y gate 103 off, and brings all the bit lines $BL_1$, to $BL_j$ to a floating state.

As described above, voltages are applied to all the memory cells in memory cell matrix 101 as shown in Table 4. As a result, all the memory cells in memory cell matrix 101 are erased.

(ii) Programming operation

Here, assume that memory transistor $Q_{11}$ is programmed. More specifically, data "0" is programmed in memory transistor $Q_{11}$, and the other memory cells in memory cell matrix 101 latch data "1".

High voltage generating circuit 112 applies a high voltage to X address decoder 102. X address decoder 102 selects word line $WL_1$ in response to an X address signal applied from address buffer 105, applies a high voltage (8 V) to the selected word line $WL_1$, and applies 0 V to non-selected word lines $WL_2$ to $WL_i$.

Negative voltage generating circuit 110 applies a negative voltage to Y address decoder 104. First, data "0" is externally applied to program circuit 106 through data input/output buffer 108 to be latched. Y address decoder 104 sends bit line select information to Y gate 103 in response to a Y address signal applied from address buffer 105. Y gate 103 selects bit line $BL_1$, applies a program voltage (−5 V) corresponding to the data "0" to the selected bit line $BL_1$, and applies 0 V to non-selected bit lines $BL_2$ to $BL_j$.

Source control circuit 109 brings source line SL to a floating state. Well potential generating circuit 113 applies 0 V to n well region 114.

As described above, voltages are applied to memory transistor $Q_{11}$ as shown in Table 5. As a result, the threshold voltage of memory transistor $Q_{11}$ is increased (since the threshold voltage is negative, it changes towards 0).

(iii) Reading operation

Here, assume that data is read out from memory transistor $Q_{11}$. X address decoder 102 selects word line $WL_l$ in response to the X address signal applied from address buffer 105, and applies 0 V to the selected word line. At this time, X address decoder 102 applies 3 V to non-selected word lines $WL_2$ to $WL_i$. Y address decoder 104 sends bit line select information to Y gate 103 in response to the Y address signal applied from address buffer 105. Y gate 103 selects bit line $BL_1$, and 2 V is applied to bit line $BL_1$. 3 V is applied to non-selected bit lines $BL_2$ to $BL_j$. Source control circuit 109 applies 3 V to source line SL. Well potential generating circuit 113 applies 3 V to n well region 114. Thus, voltages are applied to the selected memory transistor $Q_{11}$ as shown in Table 6. As a result, if the content of memory transistor $Q_{11}$ is "1", bit line $BL_1$ is supplied with a read current. This read current is sensed by sense amplifier 107 and provided to the outside world through input/output buffer 108.

As described above, in the NOR type flash memory of the present embodiment, a high voltage used for programming and erasing can be generated in a boost circuit within a chip, since a small amount of current is consumed in programming and erasing. Therefore, an external power supply voltage can be supplied using an arbitrary single power source.

Figure 10:
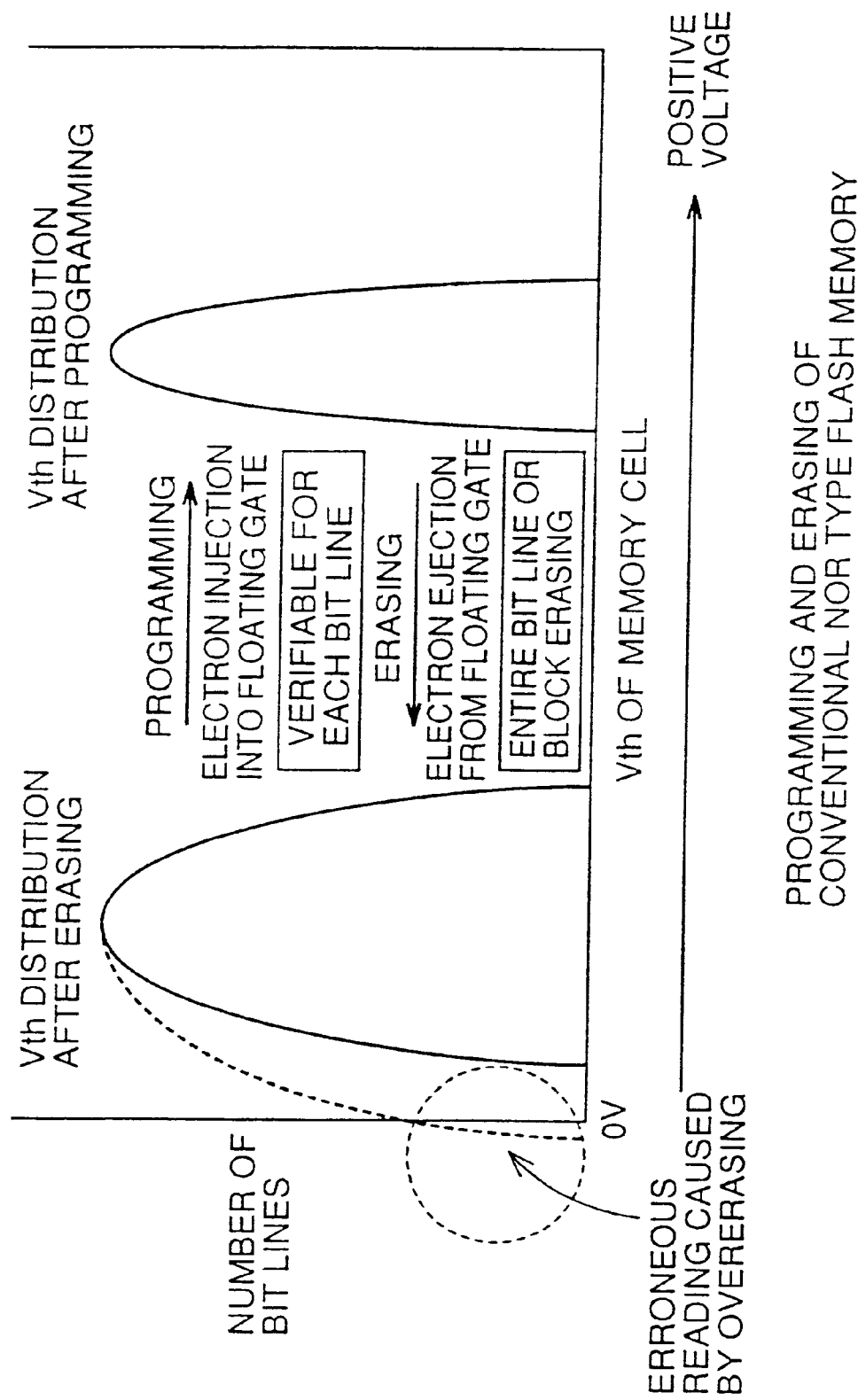
FIG. 10 is a diagram showing programming and erasing characteristics of a conventional NOR type flash memory.

Further, in the NOR type flash memory using the conventional n channel MOS type memory cells, electrons are injected into the floating gate by channel hot electron injection to carry out the programming operation as shown in FIG. 10. As a result, Vth of the memory cell is changed from the low Vth side to the high Vth side.

On the other hand, in the erasing operation, Vth of the memory cell is changed from the high Vth side to the low Vth side by ejection of electrons from the floating gate electrode to the source region or the channel region by the FN tunneling phenomenon.

The erasing operation at this time is entire bit-line erasing or entire erasing on a block basis. Since memory cells cannot be verified for every bit line, the Vth distribution after erasure becomes large. More specifically, a so-called over-erasing phenomenon occurs by the Vth distribution on the low Vth side becoming large. In the overerasing phenomenon, when a memory cell having Vth larger than 0 is generated, the memory cell is always turned on in the reading operation, causing erroneous reading.

If memory cells connected to a certain bit line are erased at a higher speed due to variation in the process or a defect, the memory cells might erroneously operate due to the over-erasing phenomenon. Therefore, making the variation in the erasing speed small is indispensable. Reduction of variation in the erasing speed has been a serious problem in the conventional NOR type flash memory using the n channel MOS memory cells.

Figure 11:
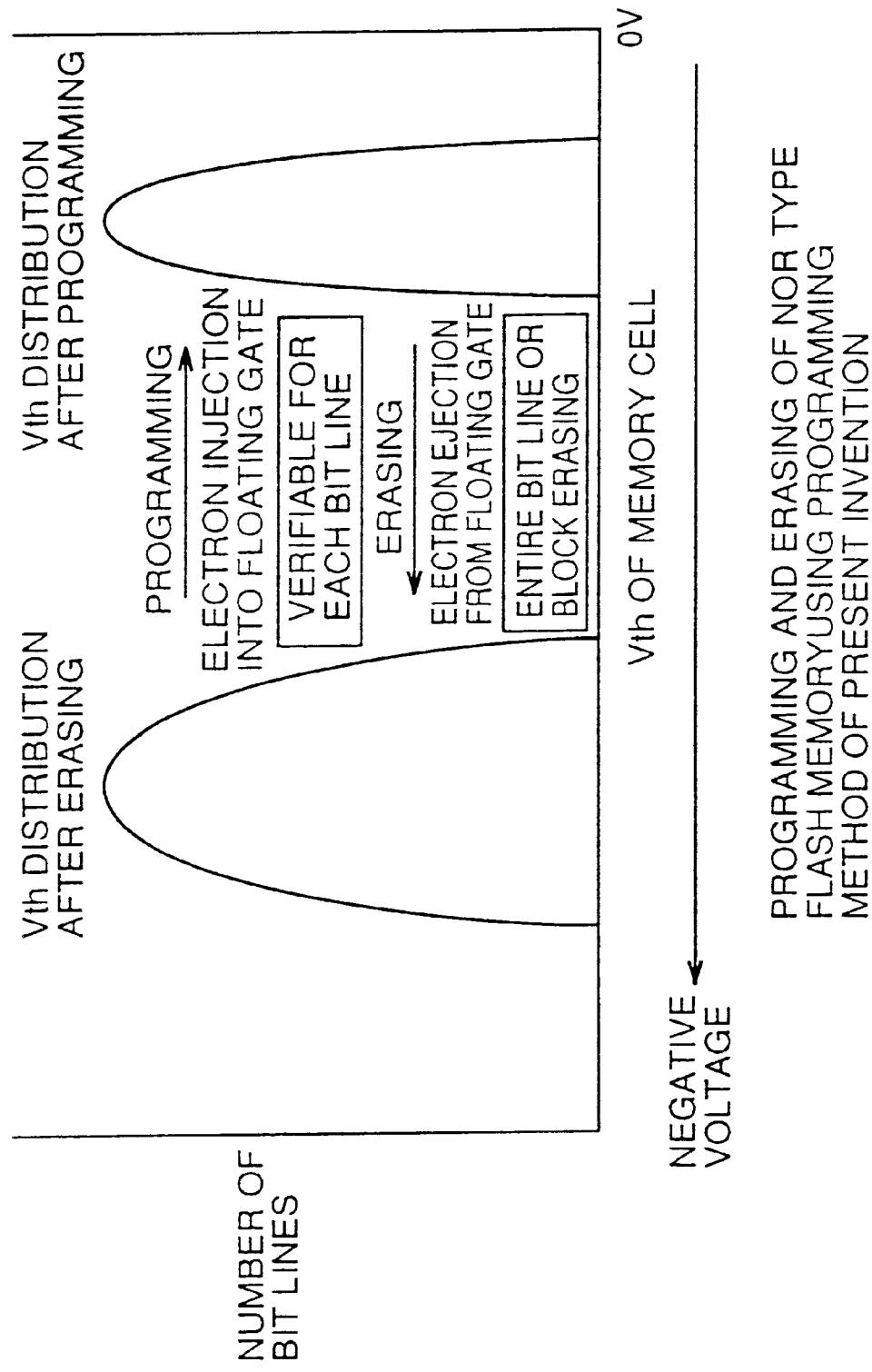
FIG. 11 is a diagram showing programming and erasing characteristics of the non-volatile semiconductor memory device according to the third embodiment.

On the other hand, in the NOR type flash memory using the p channel MOS type transistors in the above described embodiment, programming is carried out by electron injection into the floating gate electrode using the p channel MOS type transistors as a basic structure. As a result, as shown in FIG. 11, programming can be carried out from the high Vth side (Vth of a high absolute value) to the low Vth side (Vth of a low absolute value). Therefore, since a memory cell can be verified for every bit line in the programming operation, the Vth distribution after the programming operation, that is, the Vth distribution on the low Vth side, can be made small.

Further, even if memory cells connected to a bit line are programmed at a higher speed, it is possible to prevent Vth from exceeding 0. Therefore, the problem of erroneous operation caused by overerasing of the conventional NOR type flash memory can be solved.

Further, similar to the second embodiment, hot holes are hardly injected into the tunnel oxide film. Therefore, a marked deterioration of the tunnel oxide film caused by hot hole injection can be prevented. Further, it is not necessary to form an electric field relaxation layer which has hampered the effective use of the effective gate length in the conventional n channel MOS type memory cell, since hot holes are not injected. As a result, the memory cells of the present embodiment can be more miniaturized than the conventional memory cell, allowing high integration.

In the above-described second and third embodiments, the DINOR type flash memory and the NOR type flash memory were described. However, the present invention is not limited thereto. Any flash memory which carries out programming or erasing by ejecting electrons from the floating gate to the drain region by the FN tunnel current can obtain the similar effect.

In the above described second and third embodiments, the voltage application conditions in reading are not limited to those shown in Tables 3 and 6. By using voltage application conditions in reading which satisfy conditions shown in Tables 7 to 10, the similar effect can be obtained.

TABLE 7

| NOR Type Memory Cell Array | | Voltage Application Condition in Reading | | | |
|---|---|---|---|---|---|
| bit line | | word line | | source line | well |
| selected | non-selected | selected | non-selected | | |
| (Vcc-1)~(Vcc-2) | Vcc | ground | Vcc | Vcc | Vcc |

TABLE 8

| DINOR Type Memory Cell Array | | | | | | Voltage Application Condition in Reading | | | |
|---|---|---|---|---|---|---|---|---|---|
| main bit line | | sub-bit line | | select gate potential | | | | word line | |
| selected | non-selected | selected | non-selected | selected | non-selected | source line | well | selected | non-selected |
| (Vcc-1)~(Vcc-2) | Vcc | (Vcc-1)~(Vcc-2) | open | ground | Vcc | Vcc | Vcc | ground | Vcc |

TABLE 9

| NOR Type Memory Cell Array | | Voltage Application Condition in Reading | | | |
|---|---|---|---|---|---|
| bit line | | word line | | source line | well |
| selected | non-selected | selected | non-selected | | |
| −1~−2 | ground | −Vcc | ground | ground | ground |

TABLE 10

| DINOR Type Memory Cell Array | | | | | | Voltage Application Condition in Reading | | | |
|---|---|---|---|---|---|---|---|---|---|
| main bit line | | sub-bit line | | select gate potential | | | | word line | |
| selected | non-selected | selected | non-selected | selected | non-selected | source line | well | selected | non-selected |
| −1~−2 | ground | −1~−2 | open | −Vcc | ground | ground | ground | −Vcc | ground |

(Fourth Embodiment)

A non-volatile semiconductor memory device according to the fourth embodiment of the present invention will now be described with reference to FIG. 12.

Figure 12:
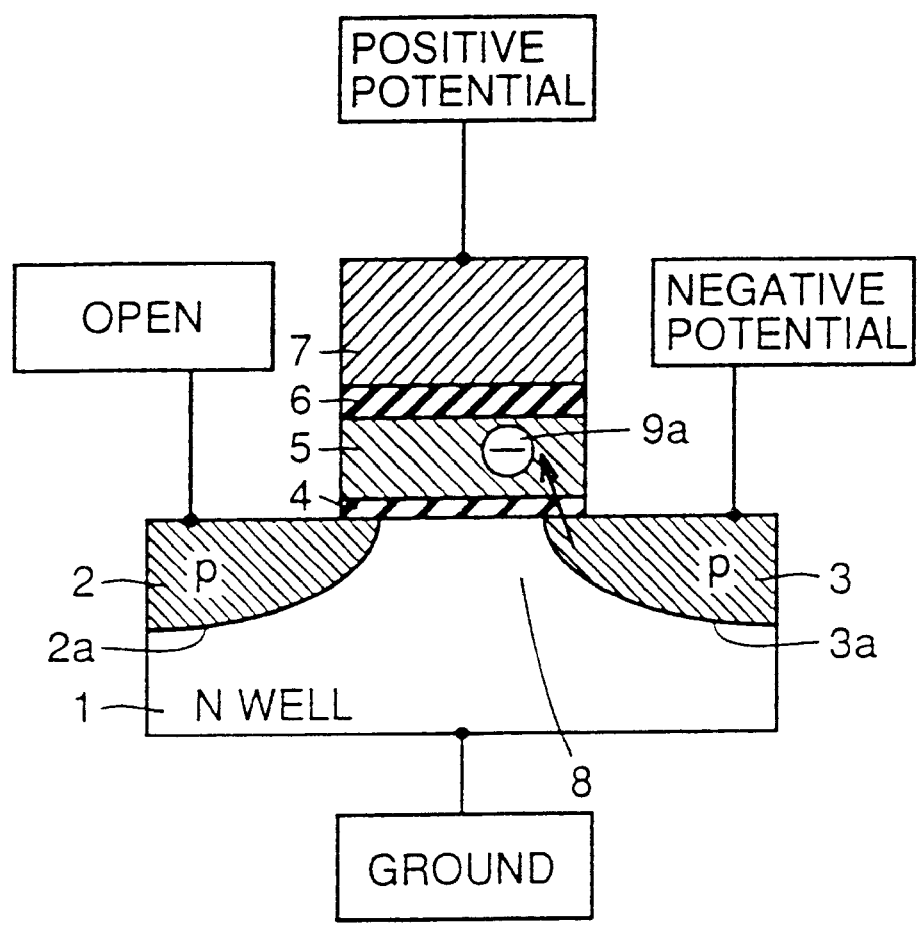
FIG. 12 is a diagram for describing programming operation of a non-volatile semiconductor memory device according to a fourth embodiment.

Referring to FIG. 12, the non-volatile semiconductor memory device according to the fourth embodiment includes source region 2 of a p type impurity region and drain region 3 of a p type impurity region formed in the surface of n well 1, similar to the first embodiment. Note that pn junctions 2a and 3a are formed at boundaries between source region 2 and n well 1, and drain region 3 and n well 1.

The non-volatile semiconductor device further includes floating gate electrode 5 formed on channel region 8 sandwiched by source region 2 and drain region 3 with tunnel oxide film 4 therebetween, and control gate electrode 7 formed on floating gate electrode 5 with insulating film 6 therebetween.

In the non-volatile semiconductor memory device structured as described above, the same voltage application conditions as those of the first embodiment are laid down at the time of programming. More specifically, a positive potential is applied to control gate electrode 7, a negative potential is applied to drain region 3, source region 2 is in an open state, and n well 1 is grounded. As a result, a strong electric field is applied to tunnel oxide film 4 on a region where floating gate electrode 5 and drain region 3 overlap with each other. Due to the FN tunneling phenomenon, electrons are injected into floating gate electrode 5 from drain region 3 through tunnel oxide film 4. Programming is thus carried out.

As a result, in the programming operation, the similar effect as that of the first embodiment can be obtained.

(Fifth Embodiment)

Figure 13:
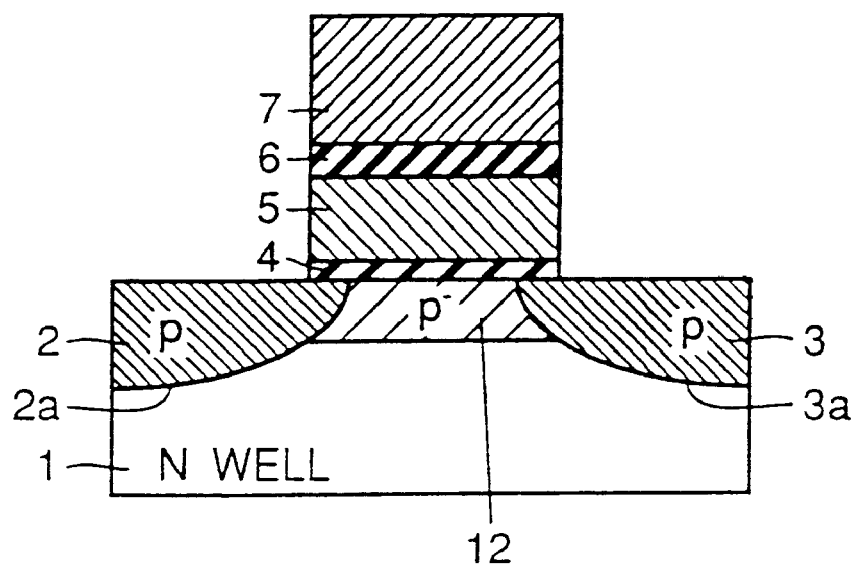
FIG. 13 is a sectional view showing a structure of a non-volatile semiconductor memory device according to a fifth embodiment.

A structure of a non-volatile semiconductor memory device according to the fifth embodiment of the present invention will now be described with reference to FIG. 13.

The non-volatile semiconductor memory device according to the present embodiment further includes a p⁻ type buried layer 12 formed in the channel region of the non-volatile semiconductor memory device of the first embodiment shown in FIG. 1.

According to the structure shown in FIG. 1, channel layer 8 is formed at the interface between n well 1 and tunnel oxide film 4. Therefore, holes flowing through channel layer 8 are scattered at the interface between n well 1 and tunnel oxide film 4, whereby the mobility of the holes is decreased. As a result, the driving ability of the non-volatile semiconductor memory device may be decreased.

By providing p⁻ type buried layer 12 in channel layer 8 as shown in the present embodiment, reduction of the mobility of the holes by scattering at the interface between n well 1 and tunnel oxide film 4 can be prevented, thereby implementing a stable driving of the non-volatile semiconductor memory device.

Note that p⁻ type buried layer 12 is preferably formed to have an impurity peak concentration positioned at a depth of approximately 10 nm to approximately 200 nm from the interface between n well 1 and tunnel oxide film 4 in an impurity distribution in the longitudinal direction in the channel region. Further, the value of the peak concentration of p⁻ type buried layer 12 is preferably $1 \times 10^{16}$ to $5 \times 10^{18}$ cm⁻³.

(Sixth Embodiment)

Figure 14:
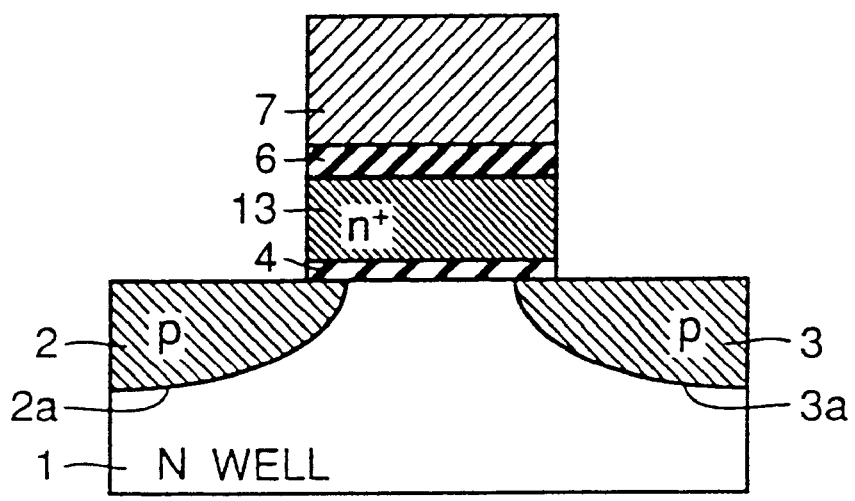
FIG. 14 is a sectional view showing a structure of a non-volatile semiconductor memory device according to a sixth embodiment.

A structure of a non-volatile semiconductor memory device according to the sixth embodiment of the present invention will now be described with reference to FIG. 14. In the structure of the non-volatile semiconductor memory device of the present embodiment, the floating gate electrode of the non-volatile semiconductor memory device of the first embodiment shown in FIG. 1 is formed of n⁺ type polysilicon 13.

By this structure, the lateral electric field of the surface in drain region 3 becomes higher, and the amount of generation of the band-to-band tunnel current is increased, as compared to the fifth embodiment. Since the acceleration electric field in drain region 3 is increased, electrons obtain higher energy. As a result, the programming efficiency is increased, whereby the programming speed can be increased and the programming voltage can be decreased. Further, as compared to the fifth embodiment, the punch-through resistance becomes higher, and memory cells can be more miniaturized, whereby the non-volatile semiconductor memory device can be highly integrated.

(Seventh Embodiment)

Figure 15:
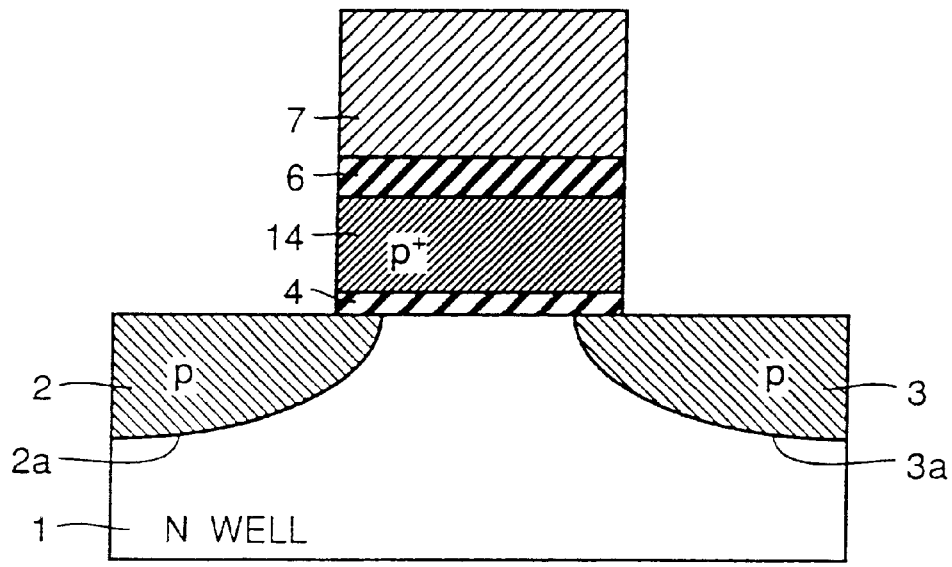
FIG. 15 is a sectional view showing a structure of a non-volatile semiconductor memory device according to a seventh embodiment.

A structure of a non-volatile semiconductor memory device according to the seventh embodiment of the present invention will now be described with reference to FIG. 15.

In the non-volatile semiconductor memory device of the present embodiment, the floating gate electrode of the non-volatile semiconductor memory device of the first embodiment shown in FIG. 1 is formed of p⁺ polysilicon.

By such a structure, as compared to the non-volatile semiconductor memory device of the fifth embodiment, the lateral electric field of the surface in drain region 3 becomes higher, the amount of generation of the band-to-band tunnel current is increased, and the acceleration electric field is increased. Therefore, electrons obtain larger energy. As a result, the programming efficiency is increased, whereby the programming speed can be increased, and the programming voltage can be decreased.

Further, as compared to the non-volatile semiconductor memory device in the fifth embodiment, the punch-through resistance becomes higher, and memory cells can be more miniaturized. As a result, the non-volatile semiconductor memory device can be highly integrated.

Further, compare the non-volatile semiconductor memory device of the seventh embodiment with that of the sixth embodiment. When the structure of the seventh embodiment is used as a DINOR type memory cell, for example, the threshold voltage of the memory cell transistor after erasure with ultraviolet rays (when the floating gate potential is 0) can be made small. Therefore, the resistance to erroneous operation caused by reading disturbance can be strengthened.

(Eighth Embodiment)

Figure 16:
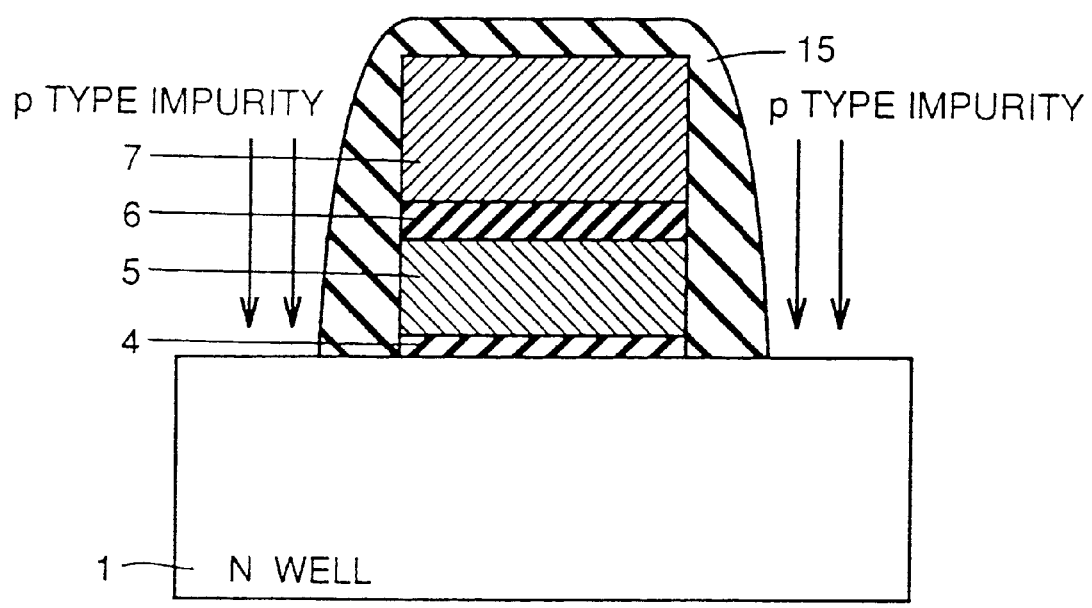
FIGS. 16 and 17 are sectional views showing the first and second manufacturing steps of a non-volatile semiconductor memory device according to an eighth embodiment.
Figure 17:
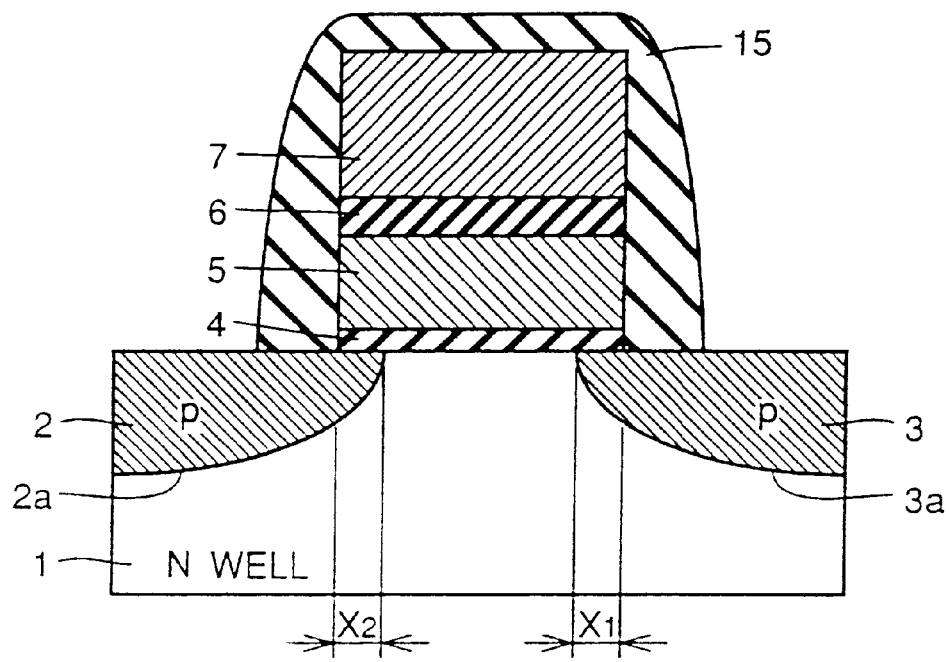

A structure of a non-volatile semiconductor memory device according to the eighth embodiment of the present invention will now be described with reference to FIGS. 16 and 17.

The non-volatile semiconductor memory device of the present embodiment is structured so that an overlap portion $X_1$ of floating gate electrode 5 and drain region 3 and an overlap portion $X_2$ of floating gate electrode 5 and source region 2 have a p type impurity concentration of $5 \times 10^{19}$ cm⁻³ or less. In order to form overlap portions $X_1$ and $X_2$ so as to have an impurity concentration of $5 \times 10^{19}$ cm⁻³ or less, a sidewall 15 is first formed so as to cover control gate electrode 7 and floating gate electrode 5 as shown in FIG. 16. After that, with sidewall 15 used as a mask, p type impurities are injected into n well 1 to form source region 2 and drain region 3.

As a result, a non-volatile semiconductor memory device having a long effective gate length and suitable for miniaturization can be obtained.

When electrons are drawn by the FN tunnel current from the floating gate electrode to the drain region as in the case of the conventional DINOR type and NOR type flash memory cells, for example, if an overlap region of the drain region with the gate electrode does not have a high impurity concentration, a depletion layer is formed at an edge portion of the drain region. This depletion layer causes a potential drop, thereby decreasing the speed at which the FN tunnel current ejects electrons. Therefore, according to the conventional structure, the source region and the drain region cannot be formed by injecting ions after formation of a sidewall. Ions must be injected with floating gate electrode 5 and control gate electrode 7 used as a mask.

On the other hand, when the p channel MOS type memory cell according to the present embodiment is used, such a problem as described above does not arise. Therefore, ions can be injected with sidewall 15 used as a mask, whereby a non-volatile semiconductor memory device which can use the gate length effectively can be provided.

(Ninth Embodiment)

A structure of a non-volatile semiconductor memory device according to the ninth embodiment of the present invention will now be described with reference to FIGS. 18 and 19.

The non-volatile semiconductor memory device according to the present embodiment is structured so that, in only an overlap portion $X_3$ of drain region 3 and floating gate electrode 5, drain region 3 has an impurity concentration of $5 \times 10^{19}$ cm⁻³ or more. In an overlap portion of source region 2 and floating gate electrode 5, source region 2 has an impurity concentration of $5 \times 10^{19}$ cm⁻³ or less, similar to the above described eighth embodiment.

Figure 18:
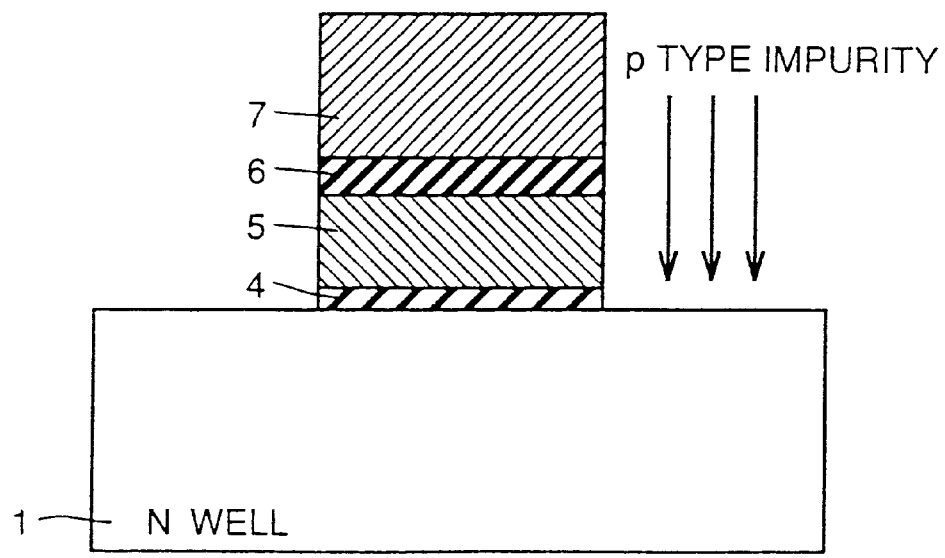
FIGS. 18 and 19 are sectional views showing the first and second manufacturing steps of a non-volatile semiconductor memory device according to a ninth embodiment.
Figure 19:
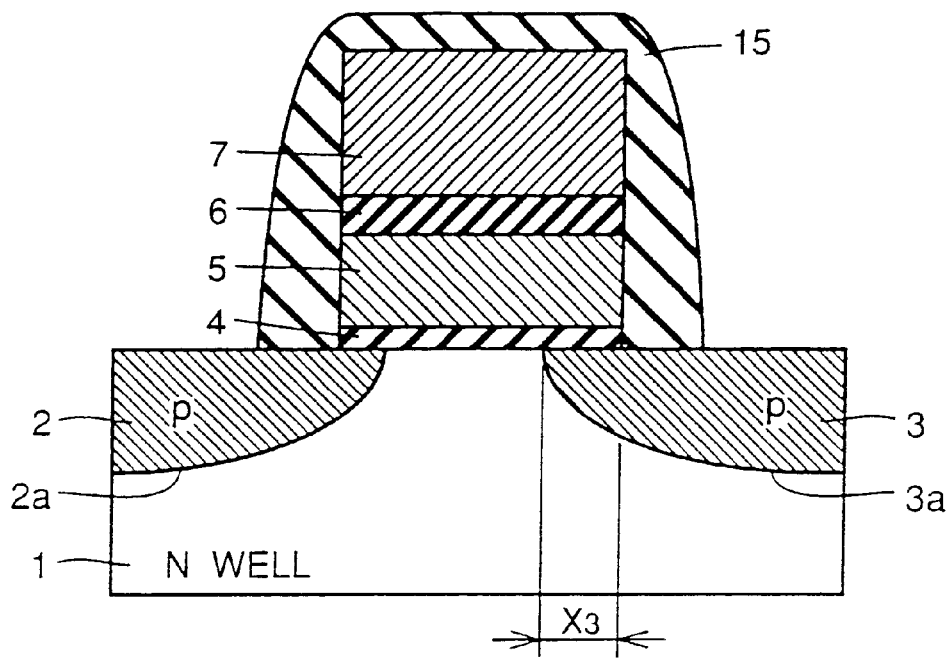

In order to form such a structure, p type impurity ions are implanted in advance into only a region where drain region 3 is to be formed with control gate electrode 7 and floating gate electrode 5 used as a mask, as shown in FIG. 18. Then, as shown in FIG. 19, sidewall 15 is formed so as to cover control gate electrode 7 and floating gate electrode 5. After that, p type impurity ions are implanted with sidewall 15 used as a mask.

By using this structure, the amount of generation of the band-to-band tunnel current in drain region 3 can be increased. As a result, the programming speed can be increased, and the drain voltage and the control gate electrode voltage at the time of programming can be decreased. Further, since ions are implanted into source region 2 after formation of sidewall 15, a memory cell having a long effective gate length can be formed.

(Tenth Embodiment)

A structure of a non-volatile semiconductor memory device according to the tenth embodiment of the present invention will now be described with reference to FIG. 20.

Figure 20:
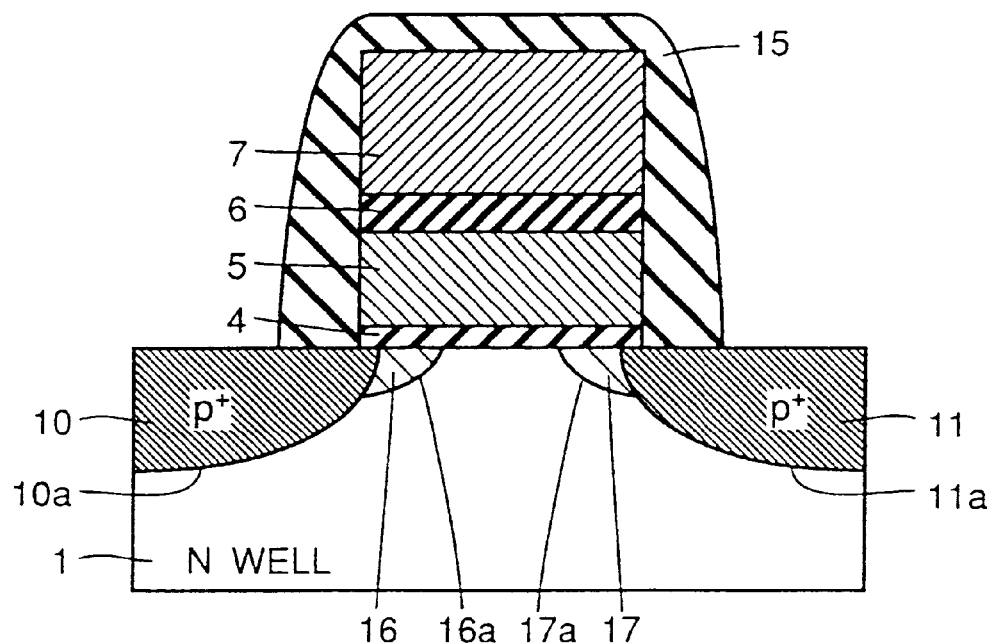
FIG. 20 is a sectional view showing a structure of a non-volatile semiconductor memory device according to a tenth embodiment.

The non-volatile semiconductor memory device according to the present embodiment includes, as shown in FIG. 20, a source region 10 and a drain region 11 both of a p+ type impurity region, and a first impurity region 16 and a second impurity region 17 formed of a p− impurity diffusion layer provided at respective edge portions of the channel region. Other than that, the structure of the non-volatile semiconductor memory device of the present embodiment is the same as that of the first embodiment shown in FIG. 1.

Note that pn junctions 11a, 12a, 16a, 17a are formed at respective interfaces between source region 10, drain region 11, first impurity region 16 and second impurity region 17, and n well 1.

By forming a so-called LDD structure as described above, a memory cell having a long effective gate length and suitable for miniaturization can be obtained.

In the conventional DINOR type or NOR type flash memory cell, for example, electrons are drawn by the FN tunnel current from the floating gate electrode to the drain region. If there exists no high impurity concentration region in an overlap region of the drain region and the floating gate electrode at this time, a depletion layer is formed at the edge portion of the drain region. Due to a potential drop in this depletion layer, the speed at which the FN tunnel current draws electrons is decreased. Further, in the conventional structure, ions must be implanted in a high concentration with the control gate electrode and the floating gate electrode used as a mask. Therefore, the effective gate length is shortened. Such problems as described above can also be cleared up in the present embodiment.

(Eleventh Embodiment)

Figure 21:
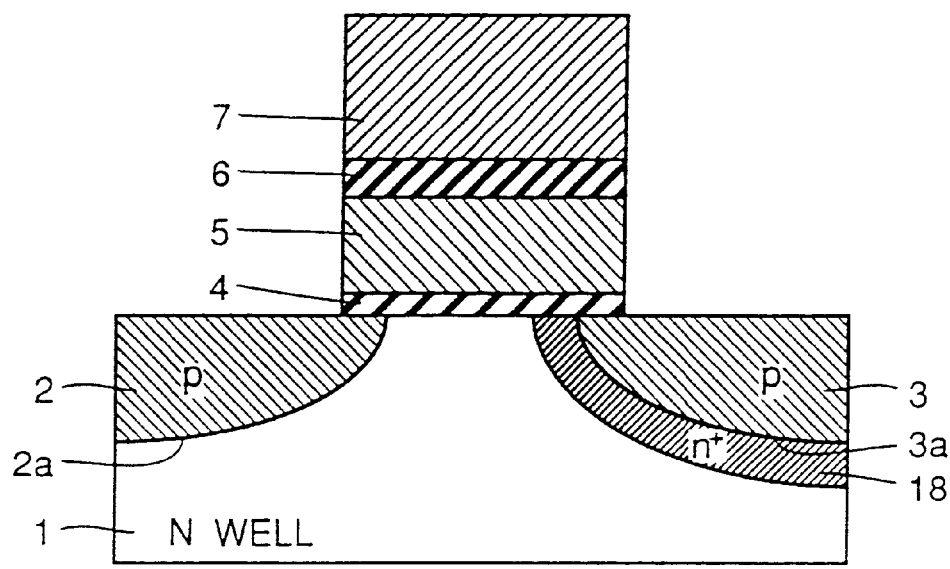
FIG. 21 is a sectional view showing a structure of a non-volatile semiconductor memory device according to an eleventh embodiment.

A structure of a non-volatile semiconductor memory device according to the eleventh embodiment of the present invention will now be described with reference to FIG. 21.

The non-volatile semiconductor memory device according to the present embodiment includes, in addition to the structure of the non-volatile semiconductor memory device in the first embodiment shown in FIG. 1, a third n+ type impurity region 18 formed so as to cover drain region 3. The impurity concentration of third impurity region 18 is approximately $1 \times 10^{17}$ to approximately $1 \times 10^{18}$ cm$^{-3}$.

By providing third impurity region 18, the lateral electric field in the depletion layer in the drain region is increased, whereby high energy can be applied to electrons efficiently. As a result, the programming speed can be increased, and the control gate voltage and the drain region voltage at the time of programming can be decreased.

(Twelfth Embodiment)

Figure 22:
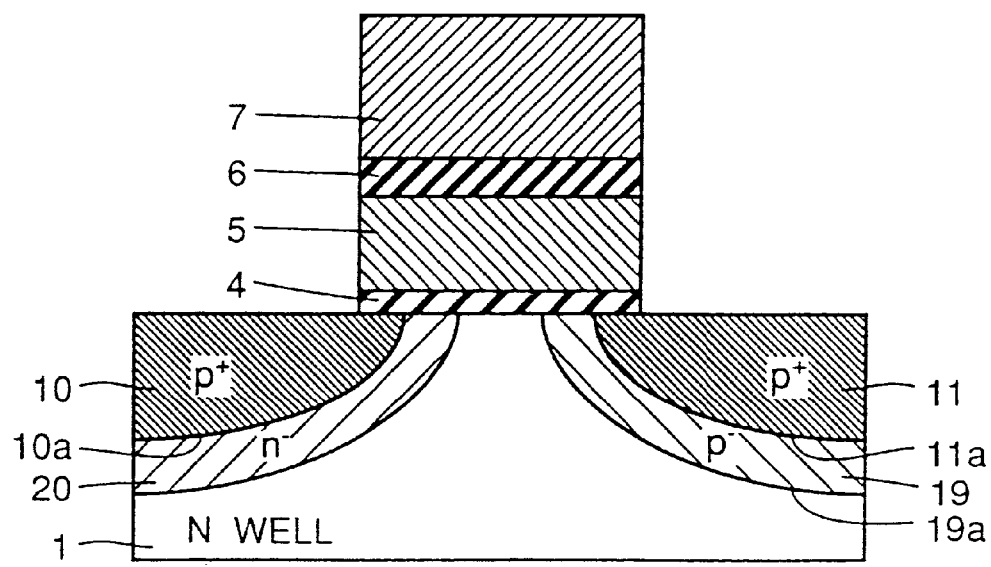
FIG. 22 is a sectional view showing a structure of a non-volatile semiconductor memory device according to a twelfth embodiment.

A structure of a non-volatile semiconductor memory device according to the twelfth embodiment of the present invention will now be described with reference to FIG. 22.

As compared with the non-volatile semiconductor memory device of the first embodiment shown in FIG. 1, the non-volatile semiconductor memory device according to the present embodiment includes source region 10 and drain region 11 of an impurity region of a high concentration, a fourth n− type impurity region 20 formed so as to cover source region 10, and a fifth p− type impurity region 19 formed so as to cover drain region 11. The pn junction 10a is formed at an interface between source region 10 and fourth impurity region 20, and a pn junction 19a is formed at an interface between fifth impurity region 19 and n well 1. The impurity concentrations of fourth impurity region 20 and fifth impurity region 19 are approximately $1 \times 10^{17}$ to approximately $1 \times 10^-$cm$^{-3}$.

By thus structured, the punch-through resistance of a memory cell is improved, and the breakdown voltage between drain region 11 and n well 1 can be improved by fifth impurity region 19.

Figure 23:
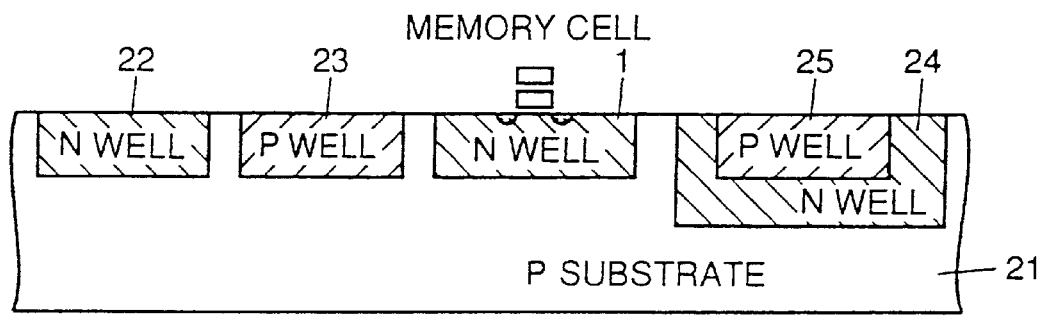
FIG. 23 is a first diagram showing another state of an n well in the first to twelfth embodiments.
Figure 24:
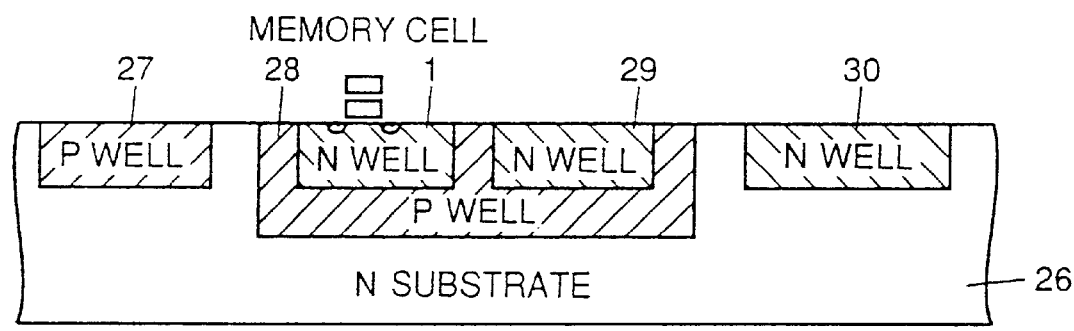
FIG. 24 is a second diagram showing a further state of the n well in the first to twelfth embodiments.
Figure 25:
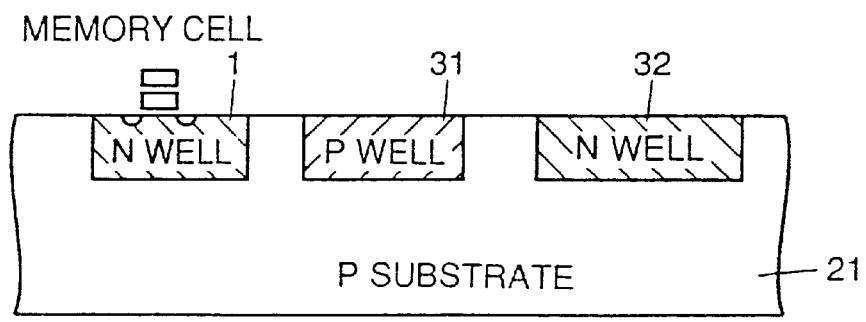
FIG. 25 is a third diagram showing a further state of the n well in the first to twelfth embodiments.

In the first to twelfth embodiments, description was given of the case where the non-volatile semiconductor memory device is formed in n well 1. This n well 1 may be formed by the same step as that for formation of n wells 22 and 24 with a process forming a triple well structure in a p type semiconductor substrate 21 as shown in FIG. 23, for example. Alternately, this n well 1 may be formed in a triple p well 28 in an n type semiconductor substrate 26 as shown in FIG. 24. Further, n well 1 may be formed with a process forming a twin well structure in p type semiconductor substrate 21 as shown in FIG. 25.

(Thirteenth Embodiment)

A non-volatile semiconductor memory device according to the thirteenth embodiment of the present invention will now be described.

In the thirteenth embodiment, a threshold voltage VTHuv (the threshold voltage when electric charge in the floating gate electrode is 0) after erasure of a memory cell with ultraviolet rays is set lower than a read voltage in a non-volatile semiconductor memory device in which programming is carried out in the same potential arrangement as that of the first embodiment. By setting the threshold voltage VTHuv lower than the read voltage, a difference ΔVTHerase between a threshold voltage VTHerase of a memory cell in an erased state and the threshold voltage VTHuv after erasure with ultraviolet rays (ΔVTHerase=VTHerase−VTHUV) becomes larger than the case where the threshold voltage VTHuv is higher than the read voltage.

At this time, the resistance to drain disturbance at the time of programming (erroneous programming in non-selected cells connected to the same bit line as that of a selected cell to which programming is carried out) is improved, whereby the reliability of a memory cell can be improved.

Assume that VTHerase=−5 V, for example, and consider the cases of VTHuv=−4 V and VTHuv=−2 V. The potential Vfg of the floating gate electrode can be calculated according to the following expression (1):

$$Vfg = -\alpha cg \times \Delta VTH + \alpha cg \times Vcg + \alpha d \times Vd + \alpha s \times Vs + \alpha sub \times Vsub \quad (1)$$

In the above expression, αcg, αd, αs, and αsub are coupling ratios of the control gate, the drain region, the source region, and the n well. These values are changeable according to the condition under which a memory cell is formed. However, here, it is considered that αcg=0.6, αd=αs=0.1, and αsub=0.2 are given as general values.

In the programming operation under the bias conditions of Vd=−6 V, Vcg=8 V, Vs=open, and Vsub=0 V, potentials of Vd=−6 V, Vcg=0 V, Vs=open, and Vsub=0 V are applied to the cells affected by drain disturbance.

Here, assume that Vs which is open is close to 0 V.

Vfg of the cells affected by drain disturbance in an erased state (ΔVTH=ΔVTHerase) at this time is calculated as follows:

1) in the case of VTHuv−4 V, ΔVTHerase=VTHerase−VTHuv=(−5)−(−4)=−1 V $$Vfg = -0.6 \times (-1) + 0.1 \times (-6) = 0 \text{ V}$$

2) in the case of VTHuv=−2 V, ΔVTHerase=VTHerase−VTHuv=(−5)−(−2)=−3 V $$Vfg = 0.6 \times (-3) + 0.1 \times (-6) = 1.2 \text{ V} \quad (2)$$

Therefore, when VTHuv=−4 V, Vfg=0 V. The potential difference between Vfg and Vd (=−6 V) is 6 V. However, when VTHuv=−2 V, Vfg=1.2 V. The potential difference between Vfg and Vd (=−6 V) is 7.2 V. The amount of generation of the band-to-band tunnel current in the cells affected by drain disturbance becomes greater in the case of VTHuv=−2 V.

More specifically, the programming speed in the cells affected by drain disturbance is higher in the case of VTHuv=−2 V. Decreasing VTHuv (since VTHuv is negative, increasing the absolute value) produces an effect of improving the resistance to drain disturbance.

(Fourteenth Embodiment)

A non-volatile semiconductor memory device according to the fourteenth embodiment of the present invention will now be described.

According to the fourteenth embodiment, in a memory cell using a programming method in the first embodiment, the threshold voltage VTHuv (the threshold voltage when electric charge in the floating gate is 0) after erasure of the memory cell with ultraviolet rays is set higher than the read voltage. By setting the threshold voltage VTHuv higher than the read voltage, the resistance to disturbance at the time of reading (erroneous erasing in a selected cell in which reading is carried out) is increased, whereby the reliability of the memory cell can be improved.

Assume that the read voltage is 3.3 V, and that the threshold voltage VTHprogram of a cell in a programmed state is −2 V, and consider the cases where VTHuv=−4 V and VTHuv=−2 V. The potential Vfg of the floating gate can be calculated according to the following expression (3):

$$Vfg = -\alpha cg \times \Delta VTH + \alpha cg \times Vcg + \alpha d \times Vd + \alpha s \times Vs + \alpha sub \times Vsub \quad (3)$$

In the above expression, αcg, αd, αs and αsub are coupling ratios of the control gate, the drain region, the source region, and the n well, respectively. These values are changeable depending on the condition under which a memory cell is formed. However, here, it is considered that αcg=0.6, αd=αs=0.1, and αsub=0.2 are given as general values.

In the reading operation under the bias conditions of Vcg−3.3 V, Vd=−1 V, Vs=0 V, and Vsub=0 V, Vfg of a read cell in the programmed state (ΔVTH=ΔVTHprogram) at this time is calculated as follows:

1) In the case of VTHuv=−4 V, ΔVTH program=VTH program−VTHuv=(−2)−(−4)=2 V $$Vfg = -0.6 \times 2 + 0.6 \times (-3.3) + 0.1 \times (-1) = 3.3 \text{ V}$$

2) In the case of VTHuv=−2 V, ΔVTH program=VTH program−VTHuv=(−2)−(−2)=0 V $$Vfg = -0.6 \times 0 + 0.6 \times (-3.3) + 0.1 \times (-1) = -2.1 \text{ V} \quad (4)$$

Therefore, when VTHuv=−4 V, Vfg=−3.3 V. The potential difference between Vfg and Vsub (=0 V) is 3.3 V. However, when VTHuv=−2 V, Vfg=−2.1 V. The potential difference between Vfg and Vsub (=0 V) is 2.1 V. It is found that the resistance to erroneous erasing caused by reading disturbance becomes lower in the case of VTHuv=−4 V.

More specifically, increasing VTHuv (since VTHuv is negative, decreasing the absolute value) produces an effect of improving the resistance to erroneous erasing caused by reading disturbance when there is a margin in error in drain disturb immunity. (When VTHuv is increased, drain disturb immunity is deteriorated, if there is no margin in error in the drain disturb immunity.)

(Fifteenth Embodiment)

A non-volatile semiconductor memory device according to the fifteenth embodiment of the present invention will now be described with reference to FIGS. 26 to 31.

In the fifteenth embodiment, the value of the negative voltage applied to the drain region is so set that an avalanche destruction will not occur in a selected memory cell for programming and non-selected memory cells (memory cells affected by drain disturbance) connected to the same bit line as the selected memory cell in the DINOR type flash memory described in the second embodiment, in order to program the memory cells.

Referring to FIG. 26, Id-Vd and Ig-Vd characteristics when Vg=6 V will be described, which are measured in a p channel MOS type memory cell having its floating gate electrode and its control gate electrode connected to each other.

Note that Id denotes a current generated by the band-to-band tunneling phenomenon, and that Ig denotes an injection current of band-to-band tunnel current induced hot electrons to the tunnel oxide film.

FIG. 26 shows that when the absolute value of Vd increases (the absolute value of Vd>6 V), the current value of Id rapidly increases (the slope of Id-Vd characteristics when the absolute value of Vd>6 V is greater than that when the absolute value of Vd<6 V). More specifically, when the absolute value of Vd is increased, there is a point of inflection $Vd_1$ at which the characteristics transition from [(logId)/Vd]"<0, that is, upward projection of the (logid)–Vd curve, to [(logId)/Vd]">0, that is, downward projection of the (logId)–Vd curve. This indicates that an avalanche destruction occurs in the drain region, and that the current value Id increases rapidly, as shown in FIG. 26.

According to *Flash Memory Technology Handbook* (Science Forum Press: 56), when the source voltage is increased in the NOR type flash memory using the conventional n channel MOS type memory cell, there are a region I and a region II in the source current, as shown in FIG. 27. Taking into consideration a temperature dependency, a substrate potential dependency, and a substrate concentration dependency of current-voltage characteristics in respective regions shown in FIG. 28, it can be considered that the region I denotes a current generated by the band-to-band tunneling phenomenon, and that the region II denotes a current generated by the avalanche destruction.

It is considered that exactly the same phenomenon as that in the NOR type flash memory using the n channel MOS type memory cell occurs also in the p channel MOS type memory cell shown in FIG. 1.

Therefore, in FIG. 26, it is considered that the current in a region where the absolute value of Vd is small is a current generated by the band-to-band tunneling phenomenon, and that the current in a region where the absolute value Vd is large and the slope of the Id-Vd characteristics is steep is a current generated by the avalanche destruction.

Figure 29:
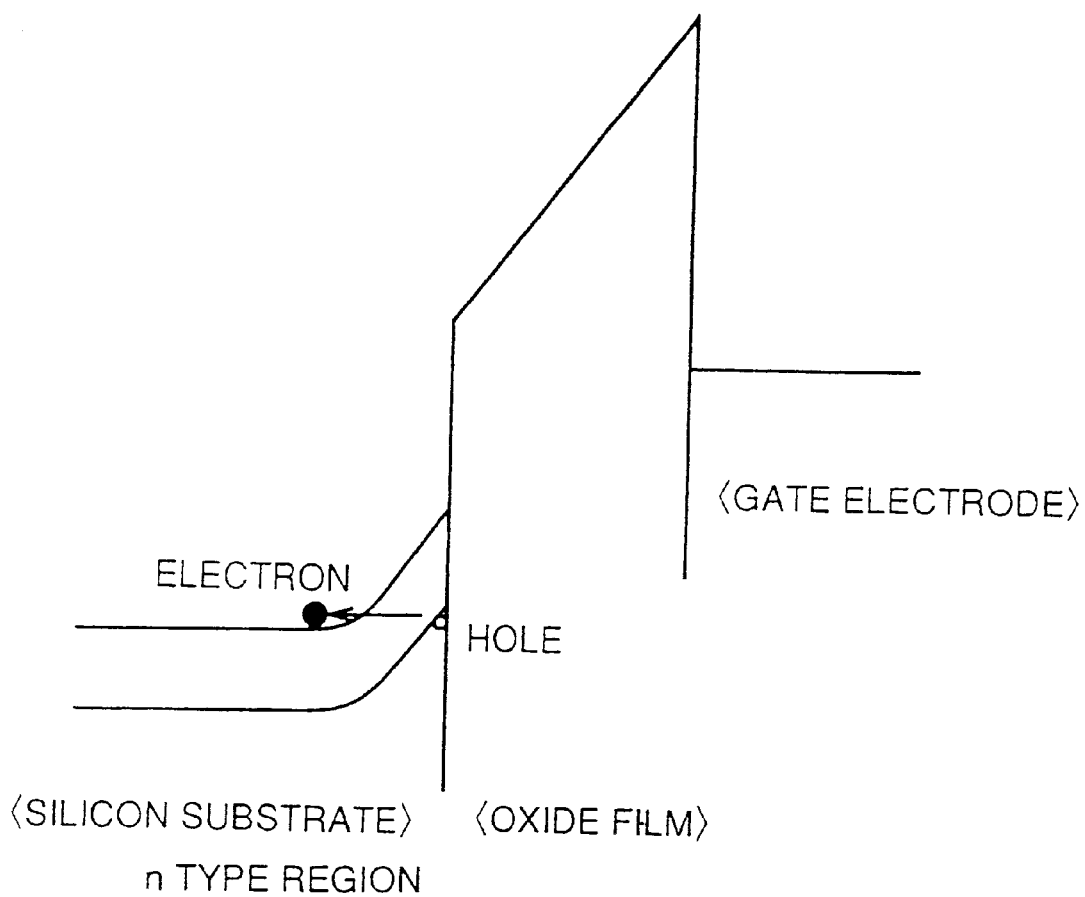
FIG. 29 is a third diagram for describing the avalanche phenomenon in the fifteenth embodiment.

When such a voltage as described above is applied between the gate electrode and the drain region in nMOS and pMOS, the band of silicon curves as shown in FIG. 29 in a deep depression region in the drain region, and electrons in the valence band tunnel into the charged body to generate electron-hole pairs. This is called a band-to-band tunneling phenomenon (cf. W. Feng et al., IEEE Electron Device Letters, (Vol. EDL-7, No. 7, July 1986): 449.

On the other hand, electrons or holes supplied with high energy by the high electric field can raise electrons in the valence band to the charged body, causing new electron-hole pairs to be generated. Many carriers are produced in an avalanche manner so that the electron-hole pairs thus generated may further generate electron-hole pairs. This phenomenon is called an avalanche destruction. As described above, the band-to-band tunneling phenomenon and the avalanche destruction phenomenon are quite different physical phenomena.

Here, under the condition shown in FIG. 26, the following calculation is carried out in order to differentiate a region of a current by the band-to-band tunneling and a region of a current by the avalanche destruction.

The amount $G_{BTBT}$ of electron-hole pairs generated by the band-to-band tunneling phenomenon per unit time in a region in a silicon substrate can be calculated according to the following expression, which has the same form as that used for calculating the amount of generation of the FN tunnel current:

$$G_{BTBT} = A \cdot Esi^2 \cdot exp(-B/Esi) \quad (A, B: \text{constants}) \quad (5)$$

In the above expression, Esi denotes an electric field intensity in the silicon substrate. When Esi is increased, the curve of the band becomes larger, indicating that the amount of generation of the band-to-band tunnel current is increased.

When a high voltage Vg-Vd is applied between the control gate electrode and the drain region as in the present embodiment, the amount of generation of the band-to-band tunnel current is maximized in the surface of the silicon substrate (the interface between the silicon substrate and the tunnel oxide film) according to the source/drain structure formed with a general method (cf. K. T. San et al. "Effects of Erase Source Bias on Flash EPROM Device Reliability," IEEE Transactions on Electron Devices, (Vol. 42, No. 1, January 1995): 150. The band-to-band tunnel current is generated only when Esi becomes high, and when the band in silicon is curved by a band gap Eg of silicon or more. Further, in the general source/drain structure, the amount of generation of the band-to-band tunnel current is maximized at a position where the curve of the band in silicon equals Eg (cf. S. A. Parke et al., IEEE Transactions on Electron Devices, (Vol. 39, No. 7, July 1992): 1694. Esi at the position where generation of the band-to-band tunnel current is maximized can be calculated by solving the following expressions (6) and (7) (cf. J. Chen et al., IEEE Electron Device Letters, (Vol. EDL-8, No. 11, November 1987): 515:

$$\epsilon si \cdot Esi = \epsilon ox \cdot Eox \quad (6)$$

$$Eox = (Vg - Vd - 1.2)/tox \quad (7)$$

In the above expressions, $\epsilon si$ and $\epsilon ox$ denote dielectric constants of silicon and a silicon oxide film, respectively, tox denotes the thickness of the tunnel oxide film, and Eox denotes the electric field in the oxide film in contact with the position at which generation of the band-to-band tunnel current is maximized, which is the interface between the silicon substrate and the tunnel oxide film.

The expression (6) indicates the continuity of the electric field in silicon and the oxide film. The expression (7) indicates that the voltage applied to the oxide film is the voltage Vg-Vd between the gate electrode and the drain region minus the potential drop caused by curving of the band by Eg (here, Eg=1.2 eV at maximum) in silicon.

When it is assumed that the total current Id generated by the band-to-band tunneling phenomenon is in proportion to the amount of the band-to-band tunnel current at a position where generation is maximized, the following expressions hold:

$$Id = A'' \cdot Esi^2 \cdot exp(-B/Esi) \quad (A', B: \text{constants}) \quad (8)$$

$$Esi = (\epsilon ox/\epsilon si) \cdot (Vg - Vd - 1.2)/tox \quad (9)$$

When the band-to-band tunnel current is plotted (so-called FN plot) with a LOG scale in the ordinate, the band-to-band tunnel current is plotted linearly in a graph representing the relationship between $Id/Esi^2$ (the ordinate axis) and 1/Esi (the abscissa axis).

Further, a region out of this linear line is considered not to be a region having the band-to-band tunneling characteristics. Accordingly, a region where the avalanche destruction occurs can be differentiated from a region where the band-to-band tunneling phenomenon occurs.

Figure 30:
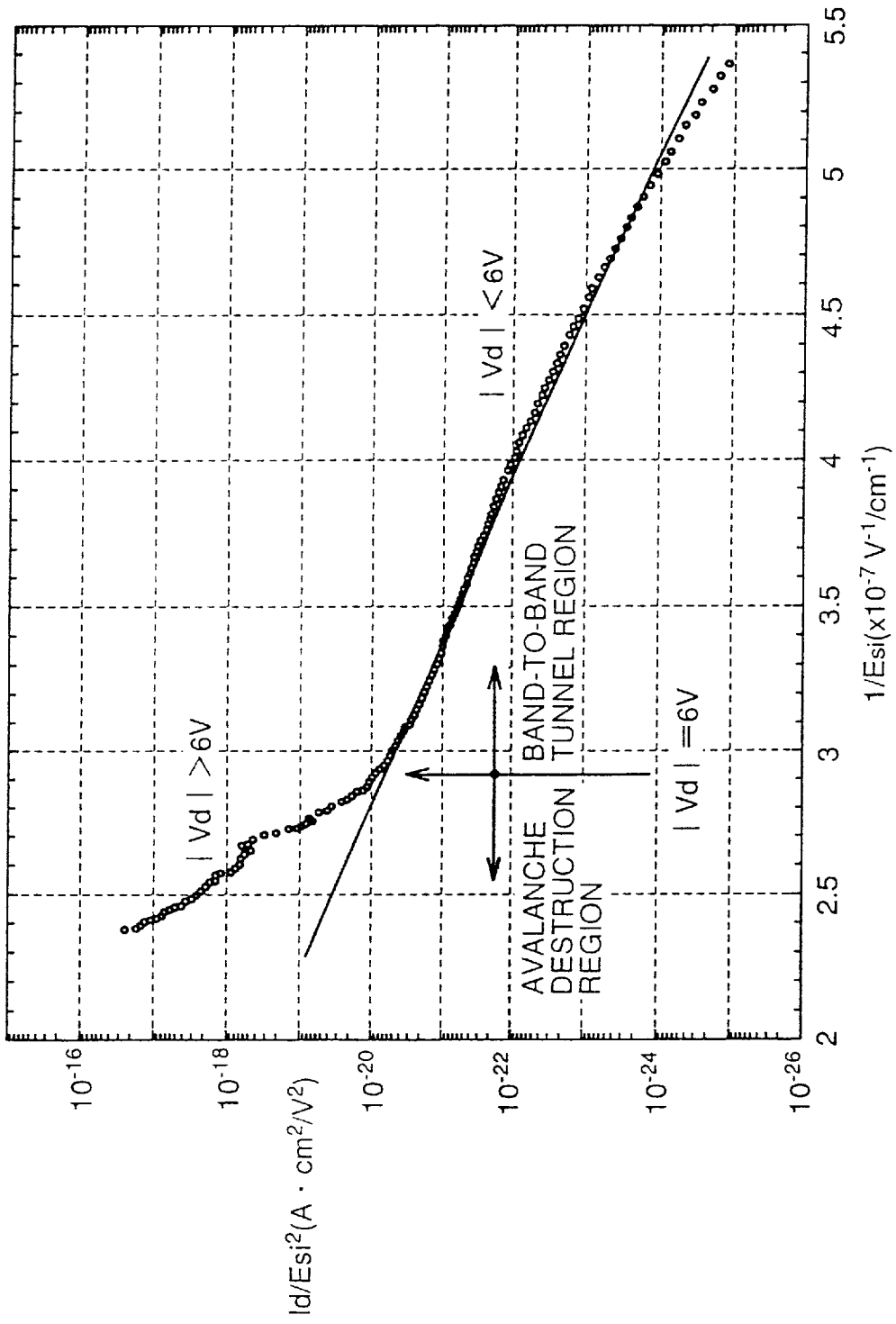
FIG. 30 is a diagram showing an FN plot of a band-to-band tunnel current Id of the non-volatile semiconductor memory device according to the fifteenth embodiment.

The result of the Id-Vd characteristics of FIG. 26 is FN plotted as shown in FIG. 30. In a region where the absolute value of Vd<6 V, the result is plotted along the linear line. However, in a region where the absolute value of Vd>6 V, the result is plotted out of the linear line. Therefore, it is found that the region of the absolute value of Vd>6 V in the Id-Vd characteristics of FIG. 26 is different from the region of the absolute value of Vd<6 V, in which the band-to-band tunneling phenomenon occurs.

When programming is carried out under the condition of application voltage causing the avalanche destruction as described above, the characteristics are deteriorated as follows.

(1) Attention is now paid to values of Ig and Id at the same Vd of FIG. 26. The injection efficiency Ig/Id monotonously increases as the absolute value of Vd becomes larger (as the lateral acceleration electric field is increased, energy of electrons becomes larger to increase the ratio of electrons moving over the barrier of the oxide film). However, the absolute value of Vd further becomes so large that the avalanche destruction might occur (in FIG. 26, the absolute value of Vd<6 V), the injection efficiency Ig/Id decreases. Therefore, it is found that programming at Vd not causing the avalanche destruction is effective for implementation of programming at a high efficiency with low current consumption.

Figure 31:
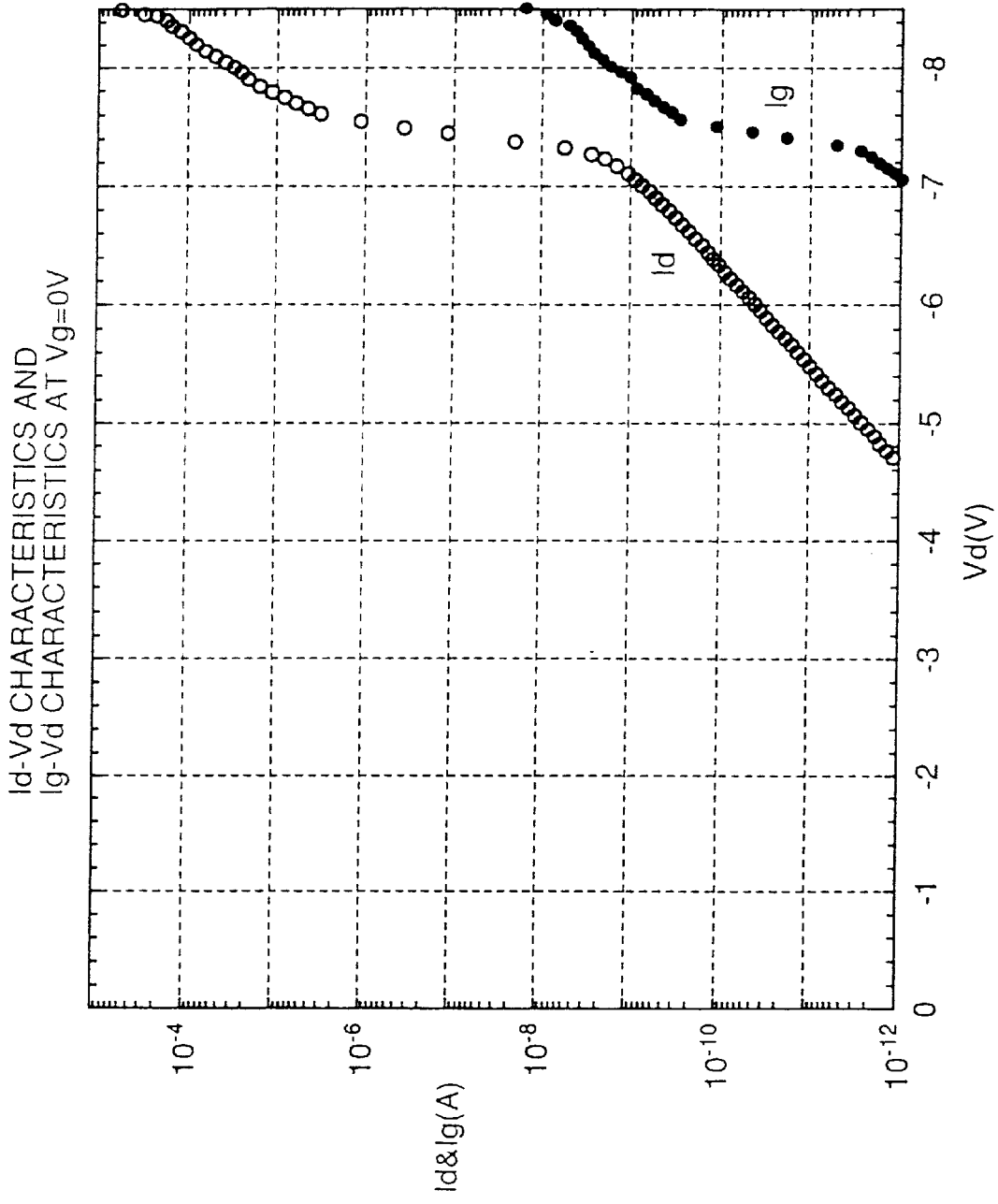
FIG. 31 is a diagram showing Id-Vd characteristics and Ig-Vd characteristics at Vg=0 V of the non-volatile semiconductor device according to the fifteenth embodiment.
Figure 32:
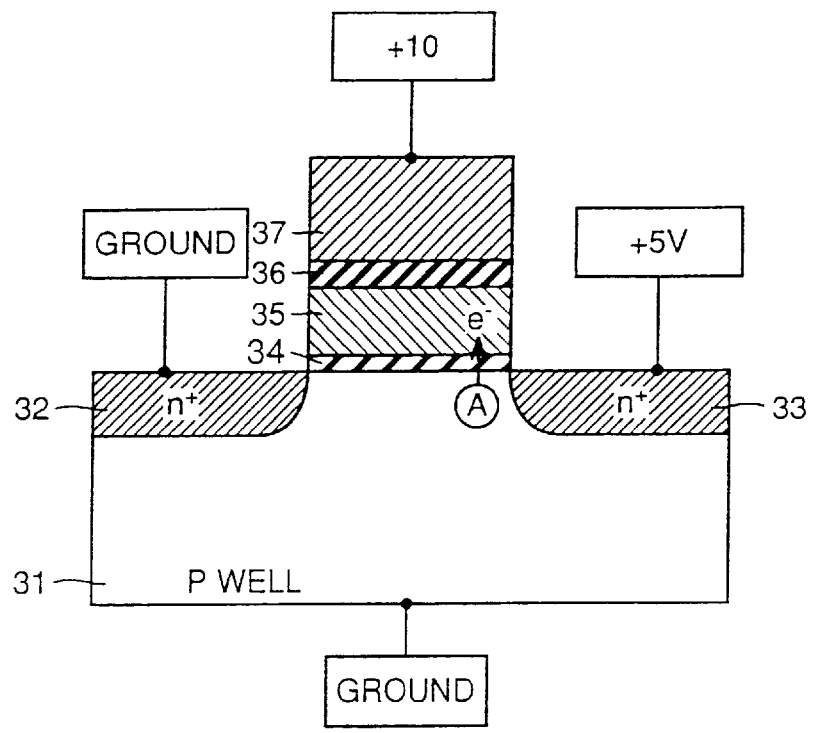
FIG. 32 is a schematic diagram for describing programming operation of a conventional NOR type memory cell.
Figure 33:
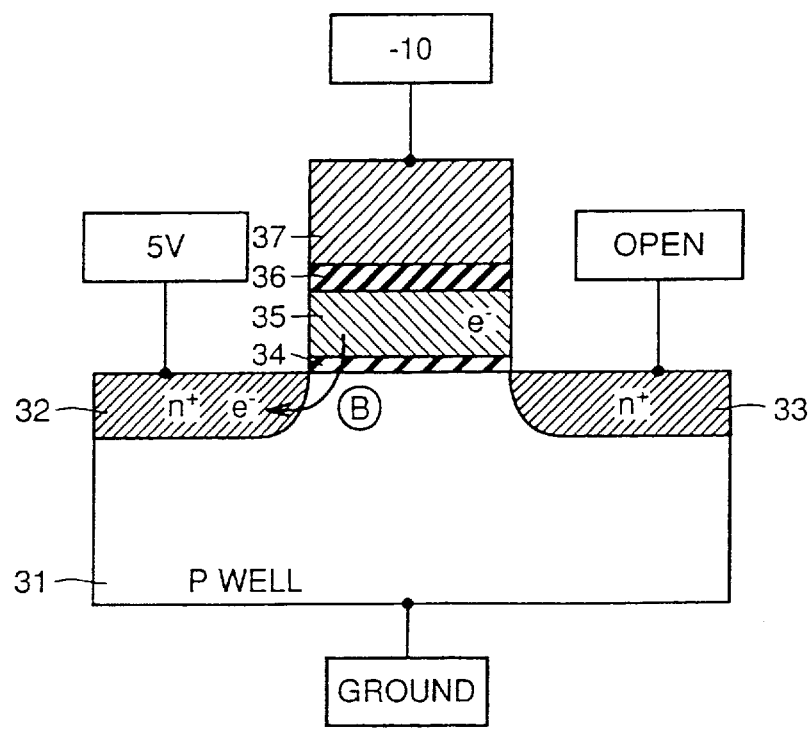
FIG. 33 is a schematic diagram for describing erasing operation of the conventional NOR type memory cell.
Figure 34:
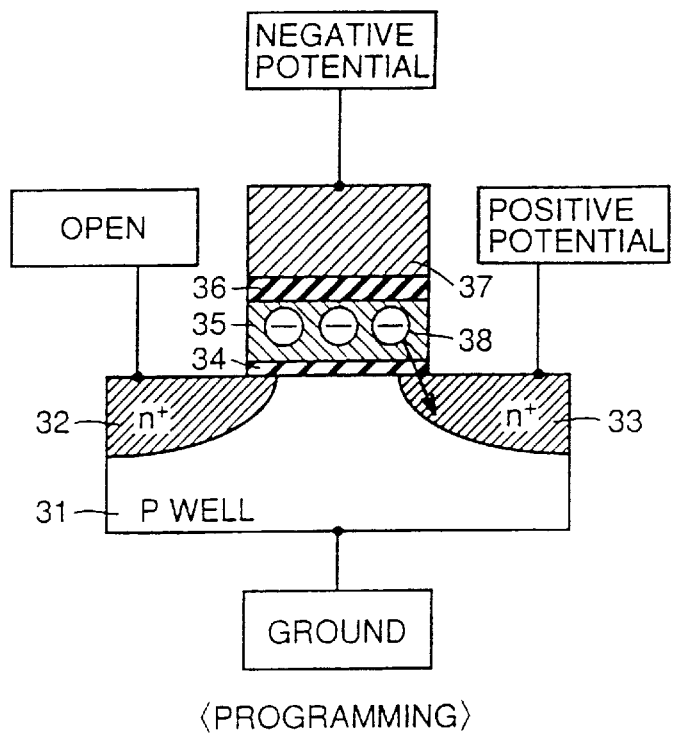
FIG. 34 is a schematic diagram for describing programming operation of a conventional DINOR type memory cell.
Figure 35:
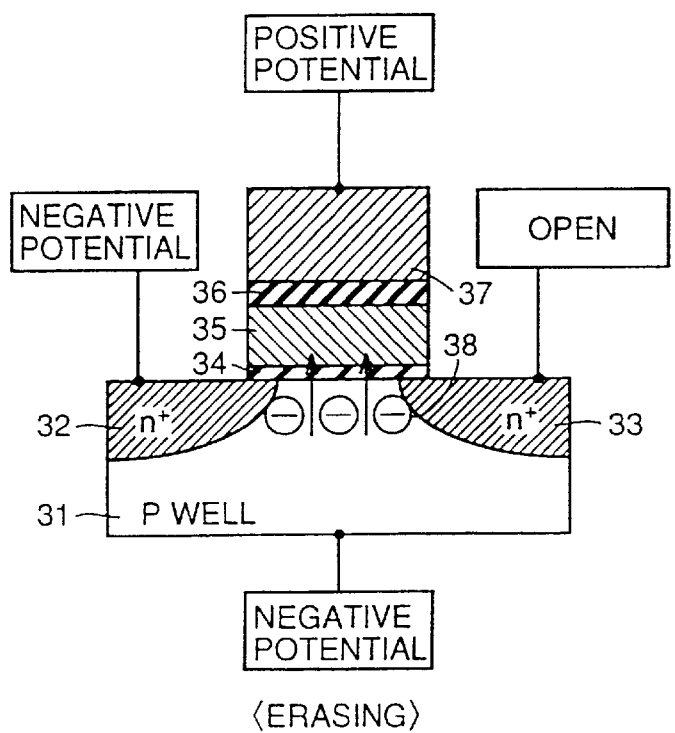
FIG. 35 is a schematic diagram for describing erasing operation of the conventional DINOR type memory cell.

(2) Id-Vd and Ig-Vd characteristics at Vg=0 V are shown in FIG. 31 when they are measured in a p channel MOS type memory cell which is the same as the memory cell shown in FIG. 26 having the floating gate electrode and the control gate electrode connected to each other. In FIG. 31 which shows the measurement result under the condition which is close to the voltage application condition of the cells affected by drain disturbance (non-selected memory cells connected to the same bit line as a selected memory cell in which programming is carried out), if attention is paid to Id, it is found that the avalanche destruction occurs at the absolute value of Vd>7.4 V, causing rapid increase in Id.

As described above, if programming is carried out at such Vd as causing the avalanche destruction in the cells afffected by drain disturbance, current consumption in the cell is significantly increased, resulting in increase in power consumption. When the programming voltage is generated using a boost circuit within a chip, the number of memory cells which are programmable in parallel is decreased, resulting in decrease in the programming speed per one memory cell, due to a limit in the current supplying ability. Thus, it is important to carry out programming at such Vd as not causing the avalanche destruction in the cells affected by drain disturbance.

Because of the above described reasons (1) and (2), deterioration of the device characteristics can be prevented by carrying out programming at a drain voltage not causing the avalanche destruction in a selected memory cell and cells affectd by drain disturbance.

(Sixteenth Embodiment)

In the sixteenth embodiment, the thickness of tunnel oxide film 4 in the p channel type MOS memory cell shown in the first embodiment is set to 15 nm or less. In the non-volatile semiconductor memory device according to the first embodiment, only when both a positive potential and a negative potential are simultaneously applied to control gate electrode 7 and drain region 3, respectively, the electron injection current is increased, and programming can be carried out at a high speed. However, in a memory cell having only a negative potential applied to its drain region, programming is not carried out. This is because a characteristic is used that the amount of generation of the band-to-band tunnel current is determined by the magnitude of the potential difference between floating gate electrode 7 and drain region 3.

Therefore, in employing the programming method according to the first embodiment, the band-to-band tunnel current must be generated effectively. This can be done by forming tunnel oxide film 4 with a thickness of 15 nm or less so that a high electric field is applied to tunnel oxide film 4 with a relative low voltage. As a result, high speed programming can be implemented.

(Seventeenth Embodiment)

In the seventeenth embodiment, the programming voltage application condition is so set that the maximum current (drain current) consumption at the time of programming is 1 $\mu$A or less per one memory cell in the second or third embodiment.

In order to implement a non-volatile semiconductor memory device which operates based on a single power source of 3 V or 5 V, a high potential used in programming is generated by a boost circuit within a chip. The current supplying capability of the boost circuit is approximately 1 mA or less. Therefore, the maximum current consumption which occurs during programming must not exceed this value.

In order to increase the effective programming speed per one memory cell, a method of simultaneously programming a number of memory cells in parallel is effectively used. If the programming speed of a memory cell is increased with the programming voltage set extremely high, deterioration of characteristics such as a marked deterioration in the resistance to reprogramming of the memory cell might be observed. However, if the method of simultaneously programming a plurality of memory cells in parallel is employed, the effective programming speed per one memory cell can be increased without causing such deterioration of the characteristics.

When the method of simultaneously programming a plurality of memory cells in parallel is employed, the circuit structure is complicated more or less. Therefore, unless at least 1000 memory cells are simultaneously programmed in parallel to increase the effective programming speed per one memory cell by three digits or more, the significance of employing the parallel programming method cannot be proved. In order to simultaneously program at least 1000 memory cells in parallel, the maximum current (drain current) consumption per one memory cell which occurs during programming must be at least 1 $\mu$A. This is because the maximum current consumption which occurs at the time of programming is limited to 1 mA or less by the current supplying ability of the above described boost circuit.

Therefore, by setting the programming voltage application condition so that the maximum current (drain current) consumption per one memory cell which occurs at the time of programming is 1 $\mu$A or less, at least 1000 memory cells can be simultaneously programmed in parallel. The effective programming speed per one memory cell can be increased, whereby a non-volatile semiconductor memory device which operates based on a single power source can be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile semiconductor memory device comprising:

a p type source region and a p type drain region formed in a surface of an n type region of a semiconductor substrate, with a channel region therebetween;

a layer stack overlying the channel region and comprising, in overlying sequence from the channel region:

a first insulating layer comprising a tunnel oxide film;

a floating gate charge storage electrode layer;

a second insulating layer; and a control gate electrode layer, wherein each of the layers comprising the layer stack is coextensive with the other layers of the layer stack; and data program means for programming the memory device with data, the data program means including means for injecting electrons from within the drain region to the floating gate charge storage electrode by hot electron injection induced by a band-to-band tunnel current.

2. The non-volatile semiconductor memory device as recited in claim 1, further comprising data erasure means for erasing data, said data erasure means including means for ejecting electrons from said charge storage electrode to said channel region by an FN tunnel phenomenon.

3. The non-volatile semiconductor memory device as recited in claim 1, wherein an edge of each of the source and drain regions extends beneath the respective adjacent edge of the layer stack.

4. A non-volatile semiconductor memory device comprising:

a p type source region and a p type drain region formed in a surface of an n type region of a semiconductor substrate, with a channel region therebetween;

a layer stack overlying the channel region and comprising, in overlying sequence from the channel region:

a first insulating layer comprising a tunnel oxide film;

a floating gate charge storage electrode layer;

a second insulating layer; and a control gate electrode layer, wherein each of the layers comprising the layer stack is coextensive with the other layers of the layer stack; and data program means for programming the memory device with data, the data program means including means for injecting electrons from within the drain region to the floating gate charge storage electrode without avalanche breakdown, comprising:

negative potential applying means for applying to the drain region a potential more negative than the substrate potential; and positive potential applying means for applying to the control electrode a potential more positive than the substrate potential.

5. The non-volatile semiconductor memory device as recited in claim 4, said data program means further including:
   means for bringing the potential of said source region to an open state, and
   means for bringing the potential of said n type region to a ground state.

6. The non-volatile semiconductor memory device as recited in claim 4, wherein said channel region includes a p type buried layer.

7. The non-volatile semiconductor memory device as recited in claim 4, wherein said charge storage electrode is formed of n type polysilicon.

8. The non-volatile semiconductor memory device as recited in claim 4, wherein said charge storage electrode is formed of p type polysilicon.

9. The non-volatile semiconductor memory device as recited in claim 4, wherein a portion of said drain region under said charge storage electrode has a p type dopant impurity concentration of at most $5 \times 10^{19}$ cm$^{-3}$.

10. The non-volatile semiconductor memory device as recited in claim 4, wherein
    a portion of said drain region under said charge storage electrode has an n type dopant impurity concentration of at least $5 \times 10^{19}$ cm$^{-3}$, and
    a portion of said source region under said charge storage electrode has a p type dopant impurity concentration of at most $5 \times 10^{19}$ cm$^{-3}$.

11. The non-volatile semiconductor memory device as recited in claim 4, wherein said channel region includes:
    a first impurity doped region in contact with said source region and having a p type dopant impurity concentration lower than the p type dopant impurity concentration of said source region, and
    a second impurity dopant region formed in contact with said drain region and having a p type dopant impurity concentration lower than the p type dopant impurity concentration of said drain region.

12. The non-volatile semiconductor memory device as recited in claim 4, wherein said n type region includes an n$^+$ type impurity region formed in contact with said drain region so as to surround said drain region.

13. The non-volatile semiconductor memory device as recited in claim 4, wherein said source region and said drain region are structured in symmetry to said charge storage electrode and said control electrode.

14. The non-volatile semiconductor memory device as recited in claim 4, wherein said first insulating film has a thickness of at most 15 nm.

15. The non-volatile semiconductor memory device as recited in claim 4, wherein said p type source region, said p type drain region, said charge storage electrode, and said control gate electrode form a memory cell,
    said non-volatile semiconductor memory device comprising:
    a memory cell array including a plurality of said memory cells arranged in a plurality of rows and columns;
    a word line corresponding to said plurality of rows, the control electrode of said each memory cell being connected to said word line; and
    a bit line corresponding to said plurality of columns, the drain region of each said memory cell being connected to said bit line.

16. The non-volatile semiconductor memory device as recited in claim 15, comprising a select gate transistor between said memory cell and said bit line.

17. The non-volatile semiconductor memory device as recited in claim 16, wherein said select gate transistor is between said drain region of said memory cell and said bit line.

18. The non-volatile semiconductor memory device as recited in claim 15, wherein
    said bit line includes a main bit line and a sub-bit line,
    said plurality of memory cells are divided into a plurality of sectors each including a plurality of memory cells arranged in a plurality of rows and columns,
    said non-volatile semiconductor memory device including
    a sub-bit line group provided corresponding to said plurality of sectors, and including a plurality of said sub-bit lines each corresponding to a plurality of columns in a corresponding sector, and
    a select transistor selectively connecting a plurality of said sub-bit line groups to a plurality of said main bit lines,
    said select transistor being a p channel type transistor.

19. The non-volatile semiconductor memory device as recited in claim 18, wherein said sub-bit line is made of a metal interconnection material.

20. The non-volatile semiconductor memory device as recited in claim 15, further comprising a peripheral circuit region in which a peripheral circuit for controlling operation of said memory cell is formed, wherein
    said peripheral circuit region includes a p channel type MOS transistor, and
    said source region and said drain region of said memory cell have the same structure as a source region and a drain region constituting said p channel type MOS transistor.

21. The non-volatile semiconductor memory device as recited in claim 15, wherein said memory cell has a threshold voltage lower than a read voltage of said memory cell after erasure of said memory cell with an ultraviolet ray.

22. The non-volatile semiconductor memory device as recited in claim 15, wherein said memory cell has a threshold voltage higher than a read voltage of said memory cell after erasure of said memory cell with an ultraviolet ray.

23. The non-volatile semiconductor memory device as recited in claim 15, wherein
    said negative potential applying means calculates in a Vd-Id characteristic (Vd: drain voltage, Id: drain current) a value Vd$_1$ of Vd satisfying $\{(\log Id)/Vd\}"0$ when the absolute value of Vd is increased, and
    applies a negative potential having the absolute value of Vd smaller than Vd, to said drain region, so that avalanche destruction will not occur in a selected memory cell and non-selected memory cells connected to the same bit line of the selected memory cell.

24. The non-volatile semiconductor memory device as recited in claim 15, wherein a negative potential and a positive potential are respectively applied to said drain region and said electric charge storage electrode by said negative potential applying means and said positive potential applying means so that the maximum current consumption is at most 1 p A per one memory cell.

25. The non-volatile semiconductor memory device as recited in claim 4, further comprising data erasure means for erasing data,
    said data erasure means including:
    negative potential applying means for applying a potential more negative than the potential of said n type region to said control electrode, and positive potential applying means for applying a potential more positive than the potential of said control electrode to said source region and said n type region.

26. The non-volatile semiconductor memory device as recited in claim 25, said data erasure means further including means for bringing the potential of said drain region to an open state.

27. The non-volatile semiconductor memory device as recited in claim 4, wherein said p type source region, said p type drain region, said charge storage electrode, and said control electrode form a memory cell, said non-volatile semiconductor memory device comprising:

a memory cell array including a plurality of said memory cells arranged in a plurality of rows and columns;

a plurality of main bit lines provided corresponding to said plurality of rows;

a source line provided in common to said plurality of memory cells;

said plurality of memory cells being divided into a plurality of sectors each including a plurality of memory cells arranged in a plurality of rows and columns;

a plurality of sub-bit line groups provided corresponding to said plurality of sectors and including a plurality of sub-bit lines each corresponding to a plurality of columns in a corresponding sector;

a select gate transistor selectively connecting said plurality of sub-bit line groups to said plurality of main bit lines; and read out means for reading out from a predetermined memory cell, said read out means including:

first potential applying means for applying a first potential to said main bit line and said select gate transistor which are not selected, said source line, and said n type region, second potential applying means for applying a potential lower than said first potential by 1 to 2 V to said main bit line and said sub-bit line which are selected, means for bringing the potential of a non-selected sub-bit line to an open state; and third potential applying means for applying a second potential to said select gate transistor which is selected.

28. The non-volatile semiconductor memory device as recited in claim 27, wherein said first potential is an external power supply potential having a positive value, and said second potential is a ground potential.

29. The non-volatile semiconductor memory device as recited in claim 27, wherein said first potential is a ground potential, and said second potential is an external power supply potential having a negative value.

30. The non-volatile semiconductor memory device as recited in claim 4, wherein said p type source region, said p type drain region, said electric charge storage electrode and said control form a memory cell, said non-volatile semiconductor memory device comprising:

a memory cell array including a plurality of said memory cells arranged in a plurality of rows and column;

a word line corresponding to said plurality of rows, the control electrode of said each memory cell being connected to said word line;

a bit line corresponding to said plurality of columns, the drain region of said each memory cell being connected to said bit line;

a source line to which the source region of said each memory cell is connected; and read out means for reading out from said predetermined memory cell, said read out means including first potential applying means for applying a first potential to said bit line and said word line which are not selected, said source line, and said n type region;

second potential applying means for applying a potential lower than said first potential by 1 to 2 V to said bit line which is selected; and third potential applying means for applying a second potential to said word line which is selected.

31. The non-volatile semiconductor memory device as recited in claim 30, wherein said first potential is an external power supply potential having a positive value, and said second potential is a ground potential.

32. The non-volatile semiconductor memory device as recited in claim 30, wherein said first potential is a ground potential, and said second potential is an external power supply potential having a negative value.

33. The non-volatile semiconductor memory device as recited in claim 4, wherein an edge of each of the source and drain regions extends beneath the respective adjacent edge of the layer stack.

* * * * *